(12) United States Patent
Chan

(10) Patent No.: US 7,928,808 B2
(45) Date of Patent: Apr. 19, 2011

(54) SELECTABLE LOCAL OSCILLATOR

(75) Inventor: Tony Meng Yuen Chan, Ontario (CA)

(73) Assignee: Raytheon Canada Limited, Ottawa, Ontario (CA)

( * ) Notice: Subject to any disclaimer, the term of this patent is extended or adjusted under 35 U.S.C. 154(b) by 298 days.

(21) Appl. No.: 12/277,530

(22) Filed: Nov. 25, 2008
(Under 37 CFR 1.47)

(65) Prior Publication Data

US 2010/0127788 A1 May 27, 2010

(51) Int. Cl.
*H03B 21/00* (2006.01)
*H03B 21/01* (2006.01)
*H03B 21/02* (2006.01)
(52) U.S. Cl. .............. 331/39; 331/40; 331/179
(58) Field of Classification Search .......... 331/37–41, 331/177 R, 179
See application file for complete search history.

(56) References Cited

U.S. PATENT DOCUMENTS

| | | | | |
|---|---|---|---|---|
| 2,777,953 | A | * | 1/1957 | Tollefson .............. 331/44 |
| 3,721,764 | A | * | 3/1973 | Dunn .................. 73/585 |
| 3,940,716 | A | | 2/1976 | Gebring |
| 6,324,233 | B1 | | 11/2001 | Sempel et al. |
| 7,221,917 | B2 | | 5/2007 | Kroeger |

OTHER PUBLICATIONS

PCT Search Report of the ISA for PCT/CA2009/001702 mailed Feb. 16, 2010.
PCT Written Opinion of the ISA for PCT/CA2009/001702 mailed Feb. 16, 2010.

* cited by examiner

*Primary Examiner* — David Mis
(74) *Attorney, Agent, or Firm* — Daly, Crowley, Mofford & Durkee, LLP

(57) ABSTRACT

A selectable local oscillator provides an output frequency signal having a selectable frequency within a desired output frequency range. The selectable local oscillator comprises first, second and third signal generators configured to provide first, second and third frequency signals having frequencies in first, second and third input frequency ranges. A first mixer provides a first mixed product signal having an upper sideband and a lower sideband. A frequency selector selects one of the upper and lower sidebands of the first mixed product signal. A second mixer provides a second mixed product signal having an upper sideband and a lower sideband. An output stage selects at least one of the upper and lower sidebands of the second mixed product signal as the output frequency signal.

18 Claims, 12 Drawing Sheets

Lower Half of F_lsb_range Output Table

| SG12 | SG14 | SG16 | M40 = SG14 + SG12<br>F_bpf44_range | M50 = SG16 - M40<br>F_bpf110_lsb_range |
|---|---|---|---|---|
| 14.5 | 771 | 2523.5 | 785.5 | 1738 |
| 13.5 | 771 | 2523.5 | 784.5 | 1739 |
| 12.5 | 771 | 2523.5 | 783.5 | 1740 |
| 14.5 | 768 | 2523.5 | 782.5 | 1741 |
| 13.5 | 768 | 2523.5 | 781.5 | 1742 |
| 12.5 | 768 | 2523.5 | 780.5 | 1743 |
| 14.5 | 765 | 2523.5 | 779.5 | 1744 |
| 13.5 | 765 | 2523.5 | 778.5 | 1745 |
| 12.5 | 765 | 2523.5 | 777.5 | 1746 |
| 14.5 | 771 | 2532.5 | 785.5 | 1747 |
| 13.5 | 771 | 2532.5 | 784.5 | 1748 |
| 12.5 | 771 | 2532.5 | 783.5 | 1749 |
| 14.5 | 768 | 2532.5 | 782.5 | 1750 |
| 13.5 | 768 | 2532.5 | 781.5 | 1751 |
| 12.5 | 768 | 2532.5 | 780.5 | 1752 |
| 14.5 | 765 | 2532.5 | 779.5 | 1753 |
| 13.5 | 765 | 2532.5 | 778.5 | 1754 |
| 12.5 | 765 | 2532.5 | 777.5 | 1755 |
| 14.5 | 771 | 2541.5 | 785.5 | 1756 |
| 13.5 | 771 | 2541.5 | 784.5 | 1757 |
| 12.5 | 771 | 2541.5 | 783.5 | 1758 |
| 14.5 | 768 | 2541.5 | 782.5 | 1759 |
| 13.5 | 768 | 2541.5 | 781.5 | 1760 |
| 12.5 | 768 | 2541.5 | 780.5 | 1761 |
| 14.5 | 765 | 2541.5 | 779.5 | 1762 |
| 13.5 | 765 | 2541.5 | 778.5 | 1763 |
| 12.5 | 765 | 2541.5 | 777.5 | 1764 |

FIGURE 4A

Higher Half of F_lsb_range Output Table

| SG12 | SG14 | SG16 | M40 = SG14 - SG12<br>F_bpf46_range | M50 = SG16 - M40<br>F_bpf108_lsb_range |
|---|---|---|---|---|
| 12.5 | 771 | 2523.5 | 758.5 | 1765 |
| 13.5 | 771 | 2523.5 | 757.5 | 1766 |
| 14.5 | 771 | 2523.5 | 756.5 | 1767 |
| 12.5 | 768 | 2523.5 | 755.5 | 1768 |
| 13.5 | 768 | 2523.5 | 754.5 | 1769 |
| 14.5 | 768 | 2523.5 | 753.5 | 1770 |
| 12.5 | 765 | 2523.5 | 752.5 | 1771 |
| 13.5 | 765 | 2523.5 | 751.5 | 1772 |
| 14.5 | 765 | 2523.5 | 750.5 | 1773 |
| 12.5 | 771 | 2532.5 | 758.5 | 1774 |
| 13.5 | 771 | 2532.5 | 757.5 | 1775 |
| 14.5 | 771 | 2532.5 | 756.5 | 1776 |
| 12.5 | 768 | 2532.5 | 755.5 | 1777 |
| 13.5 | 768 | 2532.5 | 754.5 | 1778 |
| 14.5 | 768 | 2532.5 | 753.5 | 1779 |
| 12.5 | 765 | 2532.5 | 752.5 | 1780 |
| 13.5 | 765 | 2532.5 | 751.5 | 1781 |
| 14.5 | 765 | 2532.5 | 750.5 | 1782 |
| 12.5 | 771 | 2541.5 | 758.5 | 1783 |
| 13.5 | 771 | 2541.5 | 757.5 | 1784 |
| 14.5 | 771 | 2541.5 | 756.5 | 1785 |
| 12.5 | 768 | 2541.5 | 755.5 | 1786 |
| 13.5 | 768 | 2541.5 | 754.5 | 1787 |
| 14.5 | 768 | 2541.5 | 753.5 | 1788 |
| 12.5 | 765 | 2541.5 | 752.5 | 1789 |
| 13.5 | 765 | 2541.5 | 751.5 | 1790 |
| 14.5 | 765 | 2541.5 | 750.5 | 1791 |

FIGURE 4B

Lower Half of F_usb_range Output Table

| SG12 | SG14 | SG16 | M40 = SG14 - SG12<br>F_bpf46_range | M50 = SG16 + M40<br>F_bpfl22_usb_range |
|---|---|---|---|---|
| 14.5 | 765 | 2523.5 | 750.5 | 3274 |
| 13.5 | 765 | 2523.5 | 751.5 | 3275 |
| 12.5 | 765 | 2523.5 | 752.5 | 3276 |
| 14.5 | 768 | 2523.5 | 753.5 | 3277 |
| 13.5 | 768 | 2523.5 | 754.5 | 3278 |
| 12.5 | 768 | 2523.5 | 755.5 | 3279 |
| 14.5 | 771 | 2523.5 | 756.5 | 3280 |
| 13.5 | 771 | 2523.5 | 757.5 | 3281 |
| 12.5 | 771 | 2523.5 | 758.5 | 3282 |
| 14.5 | 765 | 2532.5 | 750.5 | 3283 |
| 13.5 | 765 | 2532.5 | 751.5 | 3284 |
| 12.5 | 765 | 2532.5 | 752.5 | 3285 |
| 14.5 | 768 | 2532.5 | 753.5 | 3286 |
| 13.5 | 768 | 2532.5 | 754.5 | 3287 |
| 12.5 | 768 | 2532.5 | 755.5 | 3288 |
| 14.5 | 771 | 2532.5 | 756.5 | 3289 |
| 13.5 | 771 | 2532.5 | 757.5 | 3290 |
| 12.5 | 771 | 2532.5 | 758.5 | 3291 |
| 14.5 | 765 | 2541.5 | 750.5 | 3292 |
| 13.5 | 765 | 2541.5 | 751.5 | 3293 |
| 12.5 | 765 | 2541.5 | 752.5 | 3294 |
| 14.5 | 768 | 2541.5 | 753.5 | 3295 |
| 13.5 | 768 | 2541.5 | 754.5 | 3296 |
| 12.5 | 768 | 2541.5 | 755.5 | 3297 |
| 14.5 | 771 | 2541.5 | 756.5 | 3298 |
| 13.5 | 771 | 2541.5 | 757.5 | 3299 |
| 12.5 | 771 | 2541.5 | 758.5 | 3300 |

FIGURE 4C

Higher Half of F_usb_range Output Table

| SG12 | SG14 | SG16 | M40 = SG12 + SG14<br>F_bpf44_range | M50 = SG16 + M40<br>F_bpfl20_usb_range |
|---|---|---|---|---|
| 12.5 | 765 | 2523.5 | 777.5 | 3301 |
| 13.5 | 765 | 2523.5 | 778.5 | 3302 |
| 14.5 | 765 | 2523.5 | 779.5 | 3303 |
| 12.5 | 768 | 2523.5 | 780.5 | 3304 |
| 13.5 | 768 | 2523.5 | 781.5 | 3305 |
| 14.5 | 768 | 2523.5 | 782.5 | 3306 |
| 12.5 | 771 | 2523.5 | 783.5 | 3307 |
| 13.5 | 771 | 2523.5 | 784.5 | 3308 |
| 14.5 | 771 | 2523.5 | 785.5 | 3309 |
| 12.5 | 765 | 2532.5 | 777.5 | 3310 |
| 13.5 | 765 | 2532.5 | 778.5 | 3311 |
| 14.5 | 765 | 2532.5 | 779.5 | 3312 |
| 12.5 | 768 | 2532.5 | 780.5 | 3313 |
| 13.5 | 768 | 2532.5 | 781.5 | 3314 |
| 14.5 | 768 | 2532.5 | 782.5 | 3315 |
| 12.5 | 771 | 2532.5 | 783.5 | 3316 |
| 13.5 | 771 | 2532.5 | 784.5 | 3317 |
| 14.5 | 771 | 2532.5 | 785.5 | 3318 |
| 12.5 | 765 | 2541.5 | 777.5 | 3319 |
| 13.5 | 765 | 2541.5 | 778.5 | 3320 |
| 14.5 | 765 | 2541.5 | 779.5 | 3321 |
| 12.5 | 768 | 2541.5 | 780.5 | 3322 |
| 13.5 | 768 | 2541.5 | 781.5 | 3323 |
| 14.5 | 768 | 2541.5 | 782.5 | 3324 |
| 12.5 | 771 | 2541.5 | 783.5 | 3325 |
| 13.5 | 771 | 2541.5 | 784.5 | 3326 |
| 14.5 | 771 | 2541.5 | 785.5 | 3327 |

FIGURE 4D

SELECTABLE LOCAL OSCILLATOR

FIELD

Various embodiments are described herein for a selectable local oscillator that can be used as a selectable frequency synthesizer to produce an output frequency signal having a selectable frequency in a desired frequency range for use in various applications such as radar and communication systems, for example.

BACKGROUND

Frequency synthesizers presently find wide application in radar and/or communication systems that require generation of different frequency signals having low noise, low spurious components, a wide frequency selectable range and fast switching time. For example, radar systems utilize local oscillators to generate frequencies that are used to up-convert signals to an RF range for transmission and down-convert any received radar signals. Past approaches to frequency synthesizer design have used a signal oscillator and at least one phase lock loop for frequency generation within a limited frequency range. However, frequency bandwidth and limitations in speed for changing frequencies have made these types of indirect frequency synthesizers generally unable to meet the needs of advancing radar and communications system technologies.

In some cases, signal oscillators utilize crystal oscillators to provide specific oscillation frequencies. Use of crystal oscillators can improve system performance because crystal oscillators can be manufactured having very stable and predictable oscillation periods; hence providing low noise and low spurious oscillation frequencies. However, if the design of the radar system is changed, or if there is a change in the operational requirements of the system, which results in a change of the system operational frequencies, then a new crystal oscillator is required based on conventional system design. However, the process of producing these crystal oscillators can be very time consuming (on the order of 6 to 9 months), which can drastically delay the deployment of the system.

Furthermore, during operation, there are times during which a system has to switch between frequencies on the order of microseconds. Conventional systems can employ two crystal oscillators and switch between them as required. However, advanced systems usually require much more than two operating frequencies, therefore it is not practical to use signal oscillators that employ simple switching among crystal oscillators for systems that require 10 or more operating frequencies.

SUMMARY

In one aspect, at least one inventive embodiment described herein provides a method for configuring a selectable local oscillator to provide an output frequency signal having a selectable frequency within a desired output frequency range, wherein the method comprises: generating first, second and third selectable frequency signals from first, second and third input frequency ranges respectively; mixing the first selectable frequency signal with the second selectable frequency signal to provide a first mixed product signal having an upper sideband and a lower sideband; selecting one of the upper and lower sidebands of the first mixed product signal; mixing the selected sideband with the third selectable frequency signal to provide a second mixed product signal having an upper sideband and a lower sideband; and selecting at least one of the upper and lower sidebands of the second mixed product signal as the output frequency signal.

In another aspect, at least one inventive embodiment described herein provides a selectable local oscillator for producing an output frequency signal having a selectable frequency within a desired output frequency range, wherein the selectable local oscillator comprises: a first signal generator configured to provide a first selectable frequency signal having a frequency in a first input frequency range; a second signal generator configured to provide a second selectable frequency signal having a frequency in a second input frequency range; a first mixer configured to mix the first selectable frequency signal with the second selectable frequency signal to provide a first mixed product signal having an upper sideband and a lower sideband; a frequency selector configured to select one of the upper and lower sidebands of the first mixed signal; a third signal generator configured to provide a third selectable frequency signal having a frequency in a third input frequency range; a second mixer configured to mix the output of the frequency selector with the third selectable frequency signal to provide a second mixed product signal having an upper sideband and a lower sideband; and an output stage configured to select at least one of the upper and lower sidebands of the second mixed product signal as the output frequency signal.

In another aspect, at least one inventive embodiment described herein provides a selectable local oscillator for producing an output frequency signal having a selectable frequency within a desired output frequency range, wherein the selectable local oscillator comprises: a first mixing module configured to mix first and second selectable frequency signals to provide a first mixed product signal having an upper sideband and a lower sideband; a second mixing module configured to select one of the upper and lower sidebands of the first mixed signal and mix the selected signal with a third selectable frequency signal to provide a second mixed product signal having an upper sideband and a lower sideband; and an output stage configured to select at least one of the upper and lower sidebands of the second mixed product signal as the output frequency signal.

BRIEF DESCRIPTION OF THE DRAWINGS

For a better understanding of the example embodiments described herein and to show more clearly how they may be carried into effect, reference will now be made, by way of example, to the accompanying drawings which show at least one example embodiment, and in which:

FIGS. 4A to 4D are tables illustrating the output frequency range for an example implementation of a selectable local oscillator that generally corresponds to the configuration of FIG. 2;

Figure 1:
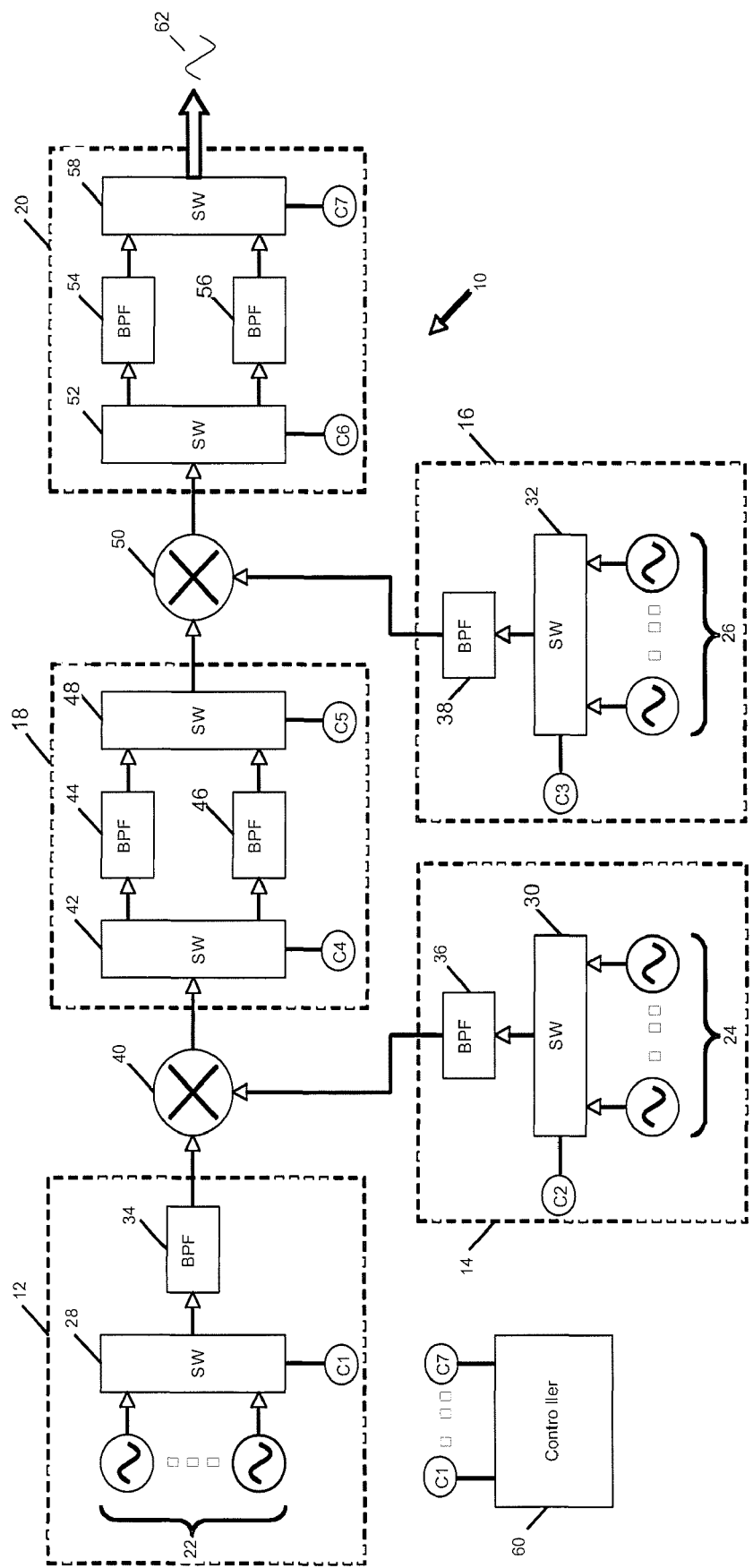
FIG. 1 is a block diagram of an example embodiment of a selectable local oscillator that can produce an output frequency signal having a selectable frequency within a desired output frequency range.

Further aspects and features of the embodiments described herein will appear from the following description taken together with the accompanying drawings. The person skilled in the art will understand that the drawings are for illustrative purposes only and that they are not intended to limit the scope of the applicant's teachings in any way.

DETAILED DESCRIPTION OF THE EMBODIMENTS

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various example embodiments described herein.

Description of the Selectable Local Oscillator

Reference is now made to FIG. 1, which shows a block diagram of an example embodiment of a selectable local oscillator 10. The selectable local oscillator 10 provides an output frequency signal with a selectable frequency within a desired output frequency range that is configurable and can be defined as $\{F_0, F_0+\Delta f, \ldots, F_0+(N-1)\cdot\Delta f\}$. The N frequencies are separated by a fixed frequency interval $\Delta f$, starting at a lower bound frequency $F_0$ and ending at an upper bound frequency $F_{N-1}$. The relationship between these parameters is shown in equation 1:

$$F_{N-1} = F_0 + (N-1)\cdot\Delta f. \tag{1}$$

In this example embodiment of FIG. 1, the selectable local oscillator 10 comprises signal generators 12, 14 and 16, mixers 40 and 50, a frequency selector 18 and an output stage 20. The selectable local oscillator 10 further comprises a controller 60 that is used to control the settings for the signal generators 12 to 16, the frequency selector 18 and the output stage 20. Coupling between these components or modules is as shown in FIG. 1. It should be noted that coupling between the various elements can be directly made using conductors or the coupling between the various elements can be made indirectly using an intermediate element such as a coaxial cable for example. In alternative embodiments, more components and/or modules can be added, such as those that are described in some further example embodiments below. In addition, it should be understood that amplifiers (not shown) can be used in various locations to increase signal strength as required.

The signal generators 12 to 16 are respectively configured to provide a selectable frequency signal having a frequency in discrete first, second and third input frequency ranges Fx_range=$\{X_0, \ldots, X_0+(N_x-1)\cdot\Delta x\}$, Fy_range=$\{Y_0, \ldots, Y_0+(N_y-1)\cdot\Delta y\}$ and Fz_range=$\{Z_0, \ldots, Z_0+(N_z-1)\cdot\Delta z\}$ respectively. These frequency ranges, Fx_range, Fy_range and Fz_range respectively, comprise $N_X$, $N_Y$ and $N_Z$ frequency signals separated by fixed frequency intervals $\Delta x$, $\Delta y$ and $\Delta z$ starting at lower bound frequencies $X_0$, $Y_0$ and $Z_0$ and ending at upper bound frequencies $X_{Nx-1}$, $Y_{Ny-1}$ and $Z_{Nz-1}$. These three frequency ranges are generally different in terms of at least one of the listed parameters, which further, in respect of each range individually, all satisfy equation 1 above when the appropriate substitutions are made.

The frequency generators 12 to 16 can be implemented according to different possible configurations. As shown in the example embodiment of FIG. 1, the signal generators 12 to 16 each comprise signal sources 22 to 26, switches 28 to 32 and filters 34 to 38. The signal sources 22 to 26 each comprise a plurality of fixed frequency oscillators $N_X$, $N_Y$ and $N_Z$, with output frequency values and frequency spacing that are selected to provide the frequency signals with frequencies in the frequency ranges of Fx_range, Fy_range and Fz_range as specified above. It should be noted that the frequency signals provided by the signal generator 14 are generally higher in frequency than the frequency signals provided by the signal generator 12 and that the frequency signals provided by the signal generator 16 are generally higher in frequency than the frequency signals provided by the signal generator 14.

The frequency signal source 22 generates frequency signals with frequencies that are typically in a frequency range below 100 MHz and it can be implemented using crystal oscillators because a crystal oscillator can provide high stability, low noise and low spurious components. The other signal sources 24 and 26 generate frequency signals with frequencies that are typically in a frequency range above 200 MHz. The signal sources 24 and 26 can be implemented using a Phase Lock Loop (PLL) Oscillator, a Variable Dielectric Resonator Oscillator (VDRO), a Variable Crystal Oscillator (VCXO) or Crystal Oscillators followed by Frequency Multipliers.

The switches 28 to 32 are configured to select one frequency signal respectively from the signal sources 22 to 26. The switches 28 to 32 are any switches that comprise at least one output and at least as many inputs as the number of frequency signals provided by the signal sources 22 to 26 respectively. In this example embodiment of FIG. 1, the switches 28 to 32 further comprise a control input to receive one of the control signals C1, C2 and C3 generated by the controller 60. In alternative embodiments, the switches 28 to 32 can include a user interface, such as a knob or push button interface, which the user can manually control to select the desired output frequency from each of the signal sources 22 to 26. Any suitable switch can be used in these embodiments as is commonly known by those skilled in the art.

The filters 34 to 38 are configured to filter out undesirable frequency components or noise from the frequency signals provided by the signal sources 22 to 26. The filters 34 to 38 can typically be bandpass filters with a passband range that corresponds to the output frequency ranges of the signal generators 12 to 16. Accordingly, the passband range of filter 34 is similar to the frequency range Fx_range which is $\{X_0, \ldots, X_0+(N_X-1)\cdot\Delta x\}$, the passband range of filter 36 is similar to the frequency range $F_Y$_range which is $\{Y_0, \ldots, Y_0+(N_Y-1)\cdot\Delta y\}$ and the passband range of filter 38 is similar to the frequency range $F_Z$_range which is $\{Z_0, \ldots, Z_0+(N_Z-1)\cdot\Delta z\}$. The filters 34 to 38 can be any filters that are suitable for mainly reducing the harmonics of the signal sources 22 to 26. Instead of using bandpass filters, the filters 34 to 38 can be lowpass filters with suitably chosen passbands, if the signal sources 22 to 26 have no sub-harmonics. The filters 34 to 38 are not needed if the signal sources 22 to 26 do not have any harmonics or sub-harmonics that result in unacceptable performance.

The mixers 40 and 50 typically generate numerous frequency products due to non-linearities. In conventional designs for oscillators, the specifications for the mixers dictate that certain higher order spurious frequencies have a certain maximum amplitude if the spurious frequencies occur in the output frequency range. This is discussed in more detail below.

The set of all output frequency products $\{f_{out}\}$ generated by the mixers 40 and 50 can be generally determined according to equation 2:

$$\{f_{out}\}=|n\cdot f_{LO}\pm k\cdot f_{IF}|\ n,k=\text{Positive Integer} \quad (2)$$

in which $f_{LO}$, $f_{IF}$ are the input frequencies that are provided to the mixer. In general, the first order output frequencies $|f_{LO}+f_{IF}|$ and $|f_{LO}-f_{IF}|$ from equation 2, constituting upper and lower sideband frequency signals, correspond to desirable frequencies that are used by the frequency selector 18 to provide input frequency signals for the output stage 20. The upper and lower sideband signals of the output stage 20 are also used to provide a desired frequency for the output frequency signal of the selectable oscillator 10. All of the other output frequencies from the mixing process defined in equation 2 correspond to higher order spurious frequency products that are generally not desirable. Depending on the magnitude of these higher order spurious frequency products, the selectable local oscillator 10 can be designed such that all spurious frequency products occur outside of the desired output frequency range. This is discussed in more detail below.

The frequency selector 18 can be considered to provide switchable filtering to transform a single mixed frequency product signal containing upper and lower sideband components into two separate signals, one for each sideband. The frequency selector 18 can be implemented according to different possible configurations. In the example embodiment shown in FIG. 1, the frequency selector 18 comprises an input switch 42, an upper sideband filter 44, a lower sideband filter 46, and an output switch 48. The input switch 42 and the output switch 48 can be any switches suitable for this application as is known by those skilled in the art. In this example embodiment of FIG. 1, the switches 42 and 48 further comprise inputs to receive control signals C4 and C5 respectively that are provided by the controller 60. In alternative embodiments, the switches 42 and 48 may be directly and manually adjustable by the user. The sideband filters 44 and 46 can be any bandpass filter that is suitable for this application as is known by those skilled in the art.

The input switch 42 of the frequency selector 18 is configured to provide the upper sideband and lower sideband components of the output signal of the mixer 40 to the sideband filters 44 and 46. The upper sideband filter 44 is configured to pass only the upper sideband component of the mixed product signal produced by the mixer 40 by filtering out the lower sideband and all other higher order spurious frequency products. Conversely, the lower sideband filter 46 is configured to pass only the lower sideband component of the mixed product signal produced by the mixer 40 by filtering out the upper sideband and all other higher order spurious frequency products. The output switch 48 is configured to select either one of the corresponding outputs of the sideband filters 44 and 46, which are an upper and a lower sideband frequency signals respectively.

The output stage 20 is different, but similar, to the frequency selector 18. The output stage 20 can be considered to provide switchable filtering to select one of the two components, i.e. the upper sideband component or the lower sideband component, of the mixed frequency product signal that is output by the mixer 50 as the output frequency signal 62. The output stage 20 can be implemented according to different possible configurations. In the example embodiment shown in FIG. 1, the output stage 20 comprises an input switch 52, sideband filters 54 and 56, and an output switch 58. The input switch 52 and the output switch 58 can be any switches suitable for this application as is known by those skilled in the art. In this example embodiment of FIG. 1, the switches 52 and 58 further comprise inputs to receive control signals C6 and C7 that are provided by the controller 60. In alternative embodiments, the switches 52 and 58 may be directly and manually adjustable by the user. The sideband filters 54 and 56 can be any bandpass filter that is suitable for this application as is known by those skilled in the art.

Figure 2:
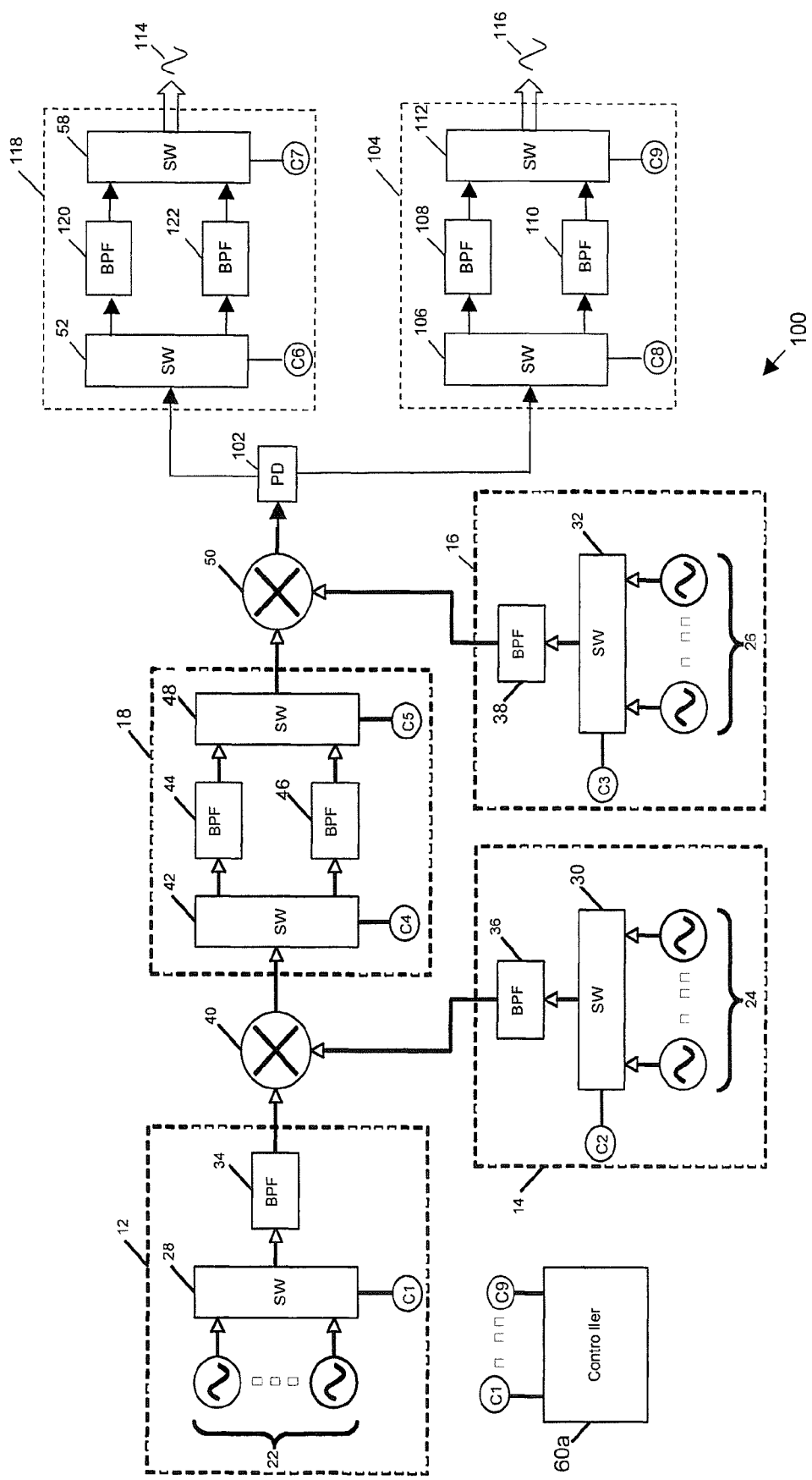
FIG. 2 is a block diagram of another example embodiment of a selectable local oscillator that can produce two output frequency signals each having a selectable frequency within a desired output frequency range.

The input switch 52 of the output stage 20 is configured to provide the output signal of the mixer 50 to the sideband filters 54 and 56. The sideband filter 54 is configured to pass only the upper (or only the lower) sideband of the output of the mixer 50 for each possible combination of frequency signals in the frequency range Fz_range of the signal generator 16 and the frequency range F_bpf44_range of the frequency selector 18. Conversely, the sideband filter 56 is configured to pass only the corresponding lower (or only the corresponding upper) sideband of the output of the mixer 50 for each possible combination of frequency signals in the frequency range Fz_range of the signal generator 16 and the frequency range F_bpf46_range of the frequency selector 18. The output switch 58 is configured to select either one of the corresponding outputs of the filters 54 and 56. Hence, the output stage 20 provides the output frequency signal 62 of the selectable oscillator 10, which is either in the upper sideband or the lower sideband of the output frequency range of the mixer 50 in this example embodiment shown in FIG. 1. In alternative embodiments, of which FIG. 2 is an example, the output stages can provide both the upper and lower sideband of the mixer 50 output as the selectable local oscillator output frequency signals.

It should be noted that in alternative embodiments, each of the sideband filters 54 and 56 can be implemented using more than one filter. For example, sideband filter 54 can be implemented using up to $N_z$ bandpass filters for every frequency signal in the signal generator 16 to avoid spurious frequency products in the output frequency signal 62. An example of this is described in FIG. 9, which, it will be noted, describes a selectable local oscillator 700 comprising not one but two output stages 712 and 726, similar to selectable local oscillator 100 described in FIG. 2. The number of filters that are used for each sideband depends on the output frequency range and the spurious signals that are generated. This is determined on a case-by-case basis.

In the example embodiment of FIG. 1, the selectable local oscillator 10 includes the controller 60 for controlling the signal generators 12 to 16, the frequency selector 18 and the output stage 20. The controller 60 generates control signals C1 to C3 for the switches 28 to 32 respectively in the signal generators 12 to 16, control signals C4 and C5 for the switches 42 and 48 respectively in the frequency selector 18 and control signals C6 and C7 for the switches 52 and 58 respectively in the output stage 20. The controller 60 can be an electronic device that has a user interface for receiving input from a user for configuring the adjustable components of the selectable local oscillator 10 and internal circuitry for producing control signals C1 to C7 according to the user input. For example, the controller 60 can be a computer or a microprocessor with an appropriate user interface. In alternative embodiments, the controller 60 can be optional if the signal generators 12 to 16, the frequency selector 18 and the output stage 20 provide inputs that a user can use to configure the switches within these components.

Figure 9:
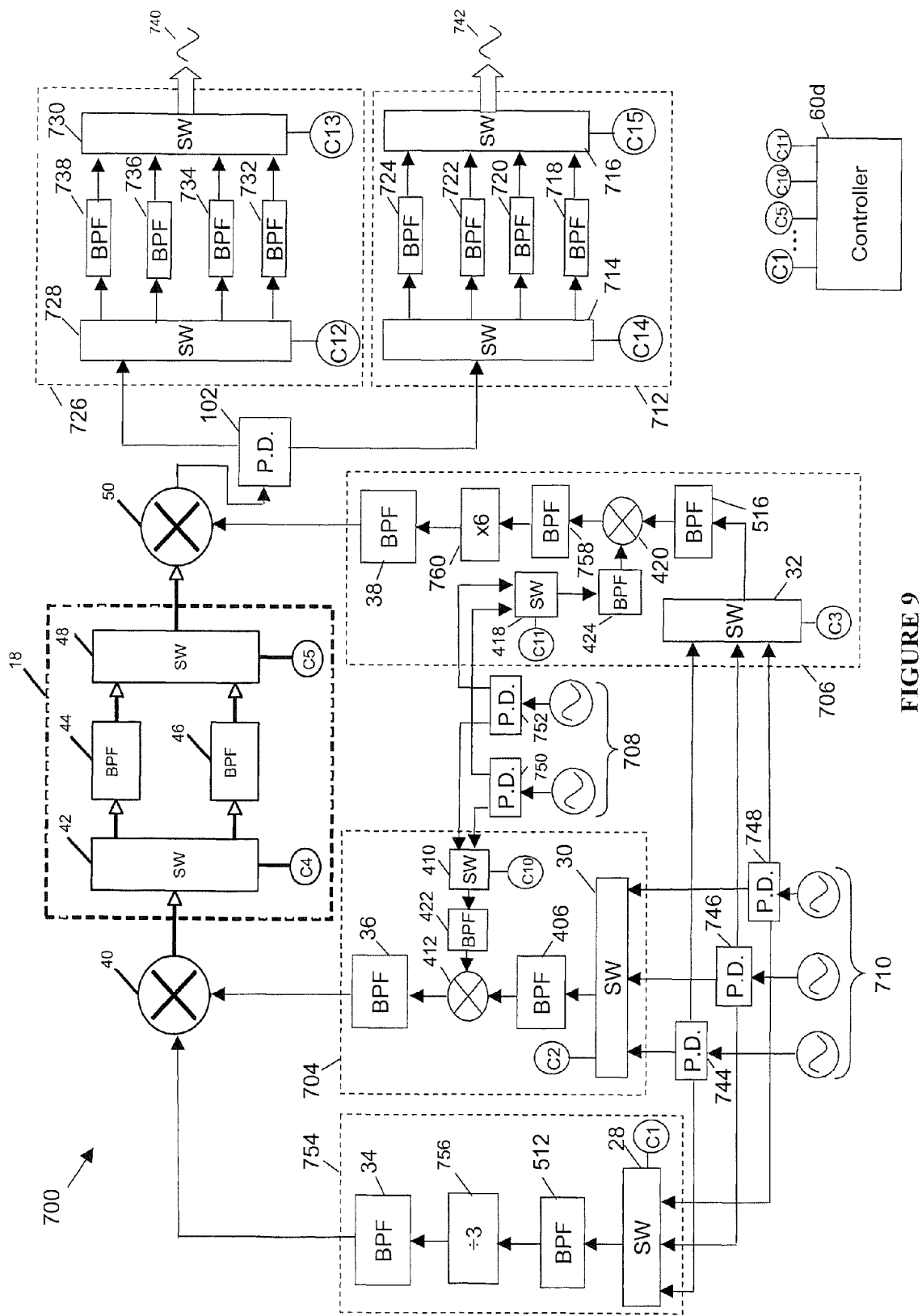
FIG. 9 is a block diagram of an example embodiment of another selectable local oscillator that can produce an output frequency signal having a selectable frequency within a desired output frequency range.

In alternative terms, the first and second signal generators 12 and 14 and the mixer 40 can be considered to be a first mixing module that mixes first and second selectable frequency signals to provide a first mixed product signal having an upper sideband and a lower sideband. The third signal generator 16, the frequency selector 18 and the mixer 50 can be considered to be a second mixing module that mixes a third selectable frequency signal and the first mixed product signal to provide a second mixed product signal having an upper sideband and a lower sideband. The output stage 20 then selects either the upper or the lower sideband of the second mixed product signal as the output frequency signal. Alternatively, more than one output stage and one or more power dividers can be used to select both the upper and lower sidebands of the second mixed signal (examples of this are shown in FIGS. 2 and 9). In this architecture, as well as in alternative architectures described below, the successive mixing operations along with the selective operation of the output stage 20 allow for a doubling in the bandwidth of the output frequency range with respect to conventional selectable oscillator designs. This unique architecture design provides both the upper and lower sideband signals of the first mixer 40 to the second mixer 50. The lower bound frequency $X_0$ of the first signal generator 12 is established to maintain the desired frequency interval $\Delta x$ in the output frequency signal 62 of the selectable local oscillator 10 of FIG. 1. This is discussed in more detail below.

Output oscillation signals from each of the signal generators 14 and 12 are mixed together by the mixer 40 to produce the first mixed product signal comprising an upper sideband and a lower sideband (spurious mixer product signals are produced as well as discussed further below). For frequency signals in the input frequency ranges Fy_range=$\{Y_0, \ldots, Y_0+(N_Y-1)\cdot\Delta y\}$ and Fx_range=$\{X_0, \ldots, X_0+(N_X-1)\cdot\Delta x\}$ provided by the signal generators 14 and 12, respectively, the switches 30 and 28 can be configured so that the mixer 40 outputs a mixed product signal for each possible combination of the frequency signals in the frequency range Fy_range provided by the signal generator 14 and the frequency signals in the frequency range Fx_range provided by the signal generator 12, i.e. one frequency signal is provided from each frequency range at a time. All of the mixed product signals produced by the mixer 40 themselves form two frequency ranges including an upper sideband range F_bpf44_range=$\{Y_0+X_0, \ldots, (Y_0+(N_Y-1)\cdot\Delta y)+(X_0+(N_X-1)\cdot\Delta x)\}$ and a lower sideband range F_bpf46_range=$\{Y_0-(X_0+(N_X-1)\cdot\Delta x), \ldots, (Y_0+(N_Y-1)\cdot\Delta y)-X_0\}$. Each frequency in the upper sideband range F_bpf44_range and lower sideband range F_bpf46_range corresponds to a first-order solution to equation 2. However, it should be understood that only one frequency signal from each of these sidebands is produced at one time by the mixer 40. Each sideband comprises $N_X \cdot N_Y$ frequency signals separated by a fixed frequency interval $\Delta x$, starting at lower bound frequencies $Y_0+X_0$ and $Y_0(X_0+(N_X-1)\cdot\Delta x)$ for the upper and lower sideband ranges respectively, and ending at upper bound frequencies $(Y_0+(N_Y-1)\cdot\Delta y)+(X_0+(N_X-1)\cdot\Delta x)$ and $(Y_0+(N_Y-1)\cdot\Delta y)-X_0$ for the upper and lower sideband ranges respectively. The frequency selector 18 then selects a signal component from either the upper or lower sideband range of the output of the mixer 40.

The outputs of the signal generator 16 and the frequency selector 18 are mixed together by the mixer 50 to produce a second mixed product signal comprising an upper sideband and a lower sideband as well as spurious mixer product signals (this is discussed further below). For a frequency signal in the frequency range Fz_range=$\{Z_0, \ldots, Z_0+(N_Z-1)\cdot\Delta y\}$ provided by the signal generator 16 and a frequency signal in the higher frequency range F_bpf44_range=$\{Y_0+X_0, \ldots, (Y_0+(N_Y-1)\cdot\Delta y)+(X_0+(N_X-1)\cdot\Delta x)\}$ and in the lower frequency range F_bpf46_range=$\{Y_0-(X_0+(N_X-1)\cdot\Delta x), \ldots, (Y_0+(N_Y-1)\cdot\Delta y)-X_0\}$ provided by the output of the frequency selector 18, the mixer 50 outputs the second mixed product signal. The switches 32, 42 and 48 can be configured so that the mixer 50 outputs a mixed product signal for each possible combination of the frequency signals in the frequency range Fz_range provided by the signal generator 16, and the frequency signals in the frequency ranges F_bpf44_range and F_bpf46_range provided by the frequency selector 18, i.e. one frequency signal is provided from each frequency range at a time. All of the various combinations of the mixed product signals produced by the mixer 50 themselves form two frequency ranges, an upper sideband frequency range F_usb_range and a lower sideband frequency range F_lsb_range, one of which is used as the output frequency range that is set for the selectable local oscillator 10 of FIG. 1. In alternative embodiments, of which FIG. 2 is an example, both of the sideband ranges can be used for the output frequency range.

In this example embodiment of FIG. 1, the output stage 20 is configured to provide the output frequency signal 62 with a frequency in only one of the two frequency ranges, i.e. the upper sideband frequency range F_usb_range or the lower sideband frequency range F_lsb_range produced by the mixer 50. For instance, if the upper sideband frequency range of the output of the mixer 50 is selected, the frequency of the output frequency signal is in the upper sideband range F_usb_range=$(F_{0,usb}, \ldots, F_{N-1,usb})$. The variable N is defined as $N=2 \cdot N_X \cdot N_Y \cdot N_Z$. The filter 54 is configured to pass only the upper sideband of the mixed product signal provided by the mixer 50 when the switches 32, 42 and 48 are configured respectively to provide a frequency signal in the frequency range $F_Z$_range=$\{Z_0, \ldots, (Z_0+(N_Z-1)\cdot\Delta z)\}$ of the signal generator 16 and the higher frequency range F_bpf44_range=$\{Y_0+X_0, \ldots, (Y_0+(N_Y-1)\cdot\Delta y)+(X_0+(N_X-1)\cdot\Delta x)\}$ of the frequency selector 18. The frequencies that can pass through the filter 54 are in the frequency range F_bpf54_usb_range=$\{Z_0+(Y_0+X_0), \ldots, (Z_0+(N_Z-1)\cdot\Delta z)+((Y_0+(N_Y-1)\cdot\Delta y)+(X_0+(N_X-1)\cdot\Delta x))\}$ which corresponds to the higher half of the output frequency range F_usb_range of the selectable local oscillator 10. The filter 56 is configured to pass only the upper sideband of the mixed product signal provided by the mixer 50 when the switches 32, 42 and 48 are configured respectively to provide a frequency signal in the frequency range Fz_range=$\{Z_0, \ldots, (Z_0+(N_Z-1)\cdot\Delta z)\}$ of the signal generator 16 and the lower frequency range F_bpf46_range=$\{Y_0-(X_0+(N_X-1)\cdot\Delta x), \ldots, (Y_0+(N_Y-1)\cdot\Delta y)-X_0\}$ of the frequency selector 18. In this case, the frequencies that can pass through the filter 56 are in the frequency range F_bpf56_usb_range={$Z_0+(Y_0-(X_0+(N_X-1)\cdot\Delta x))$, ..., $(Z_0+(N_Z-1)\cdot\Delta z)+((Y_0+(N_Y-1)\cdot\Delta y)-X_0)$}, which corresponds to the lower half of the output frequency range F_usb_range of the selectable local oscillator 10.

Similarly, if the lower sideband frequency range of the output of the mixer 50 is selected, the frequency of the output frequency signal 62 is in the lower sideband range F_lsb_range=($F_{0,lsb}$, ..., $F_{N-1,lsb}$). Once again, the variable N is defined as $N=2\cdot N_X\cdot N_Y\cdot N_Z$. The filter 54 is configured to pass only the lower sideband of the mixed product signal provided by the mixer 50 when the switches 32, 42 and 48 are configured respectively to provide a frequency signal in the frequency range $F_{Z\_}$range={$Z_0$, ..., $(Z_0+(N_Z-1)\cdot\Delta z)$} of the signal generator 16 and the lower frequency range F_bpf46_range={$Y_0-(X_0+(N_X-1)\cdot\Delta x)$, ..., $(Y_0+(N_Y-1)\cdot\Delta y)-X_0$} of the frequency selector 18. In this case, the frequencies that can pass through the filter 54 are in the frequency range F_bpf54_lsb_range={$Z_0-((Y_0+(N_Y-1)\cdot\Delta y)-X_0)$, ..., $(Z_0+(N_Z-1)\cdot\Delta z)-(Y_0-(X_0+(N_X-1)\cdot\Delta x))$}, which corresponds to the higher half of the output frequency range F_lsb_range of the selectable local oscillator 10. The filter 56 is configured to pass only the lower sideband of the mixed product signal provided by the mixer 50 when the switches 32, 42 and 48 are configured to respectively provide a frequency signal in the frequency range $F_Z$_range= {$Z_0$, ..., $(Z_0+(N_Z-1)\cdot\Delta z)$} of the signal generator 16 and the higher frequency range F_bpf44_range={$Y_0+X_0$, ..., $(Y_0+(N_Y-1)\cdot\Delta y)+(X_0+(N_X-1)\cdot\Delta x)$} of the frequency selector 18. In this case, the frequencies that can pass through the filter 56 are in the frequency range F_bpf56_lsb_range={$Z_0-((Y_0+(N_Y-1)\cdot\Delta y)+(X_0+(N_X-1)\cdot\Delta x))$, ..., $(Z_0+(N_Z-1)\cdot\Delta z)-(Y_0+X_0)$} which corresponds to the lower half of the output frequency range F_lsb_range of the selectable local oscillator 10.

Accordingly, depending on how the selectable local oscillator 10 is configured, the frequency of the output frequency signal 62 can be in an upper sideband frequency range F_usb_range=($F_{0,usb}$, ..., $F_{N-1,usb}$) or a lower sideband frequency range F_lsb_range=($F_{0,lsb}$, ..., $F_{N-1,usb}$). Each sideband includes N frequency signals separated by a fixed frequency interval Δf, starting at lower bound frequencies $F_{0,usb}$ or $F_{0,usb}$ and ending at upper bound frequencies $F_{N-1,usb}$ or $F_{N-1,usb}$. Based on the nomenclature used herein, the upper sideband output frequency range F_usb_range=F_bpf56_usb_range+F_bpf54_usb_range. Both F_bpf56_usb_range and F_bpf54_usb_range have $N_X\cdot N_Y\cdot N_Z$ frequency signals; hence the upper sideband frequency range F_usb_range provides $2\cdot N_X\cdot N_Y\cdot N_Z$ frequency signals, which allows for a doubling in the bandwidth of the output frequency range with respect to conventional selectable oscillator designs. Also it should be noted that the lower sideband output frequency range F_lsb_range=F_bpf56_lsb_range+F_bpf54_lsb_range. Similarly, both F_bpf56_lsb_range and F_bpf54_lsb_range have $N_X\cdot N_Y\cdot N_Z$ frequency signals; hence the lower sideband output frequency range F_lsb_range also provides $2\cdot N_X\cdot N_Y\cdot N_Z$ frequency signals, which allows for a doubling in the bandwidth of the output frequency range with respect to conventional selectable oscillator designs. The frequency interval Δf of the output frequency range, F_usb_range and/or F_lsb_range, is the same as that used by the signal generator 12 when generating frequencies in the frequency range Fx_range. The filter 54 can be selectively configurable to pass signals in the frequency ranges F_bpf54_lsb_range or F_bpf54_usb_range and the filter 56 can be selectively configurable to pass signals in the frequency ranges F_bpf56_lsb_range or F_bpf56_usb_range. Alternatively, more than two filters can be used and this is described in detail later with reference to FIG. 9.

Reference is now made to FIG. 2, which shows a block diagram of another example embodiment of a selectable local oscillator 100 that can produce two output frequency signals each having a selectable frequency within a desired output frequency range. In this case, the output of the mixer 50 is connected to a 1:2 power divider 102 and the two output ports of the power divider 102 are connected to the output stages 118 and 104 which are similar to the output stage 20 of FIG. 1. The filter 120 has a passband similar to the frequency range F_bpf54_usb_range and the filter 122 has a passband similar to the frequency range F_bpf56_usb_range. The filter 108 has a passband similar to the frequency range F_bpf54_lsb_range and the filter 110 has a passband similar to the frequency range F_bpf56_lsb_range. Accordingly, the output stage 118 provides an output frequency signal 114 with a frequency in the F_usb_range output frequency range and the output stage 104 provides an output frequency signal 116 with a frequency in the F_lsb_range output frequency range. The use of two filters in each output stage protects against spurious frequencies.

Design Methodology Flowchart

The signal generators 12 to 16 are configurable for selecting certain values for parameters $N_X$, $N_Y$, $N_Z$, Δx, Δy, Δz, $X_0$, $Y_0$, and $Z_0$ and the output stages 118 and 104 are also configurable to produce output frequency signals with frequencies in two desired output frequency ranges for the selectable local oscillator 100 of FIG. 2. The signal generators 12 to 16 can also be configured such that the output frequency range of the selectable local oscillator 100 contains minimal or reduced amplitude spurious mixer product signals as is described in further detail below. Likewise, the aforementioned parameters and the output stage 20 are configurable to produce output frequency signals with frequencies in a desired output frequency range for the selectable local oscillator 10.

Figure 3:
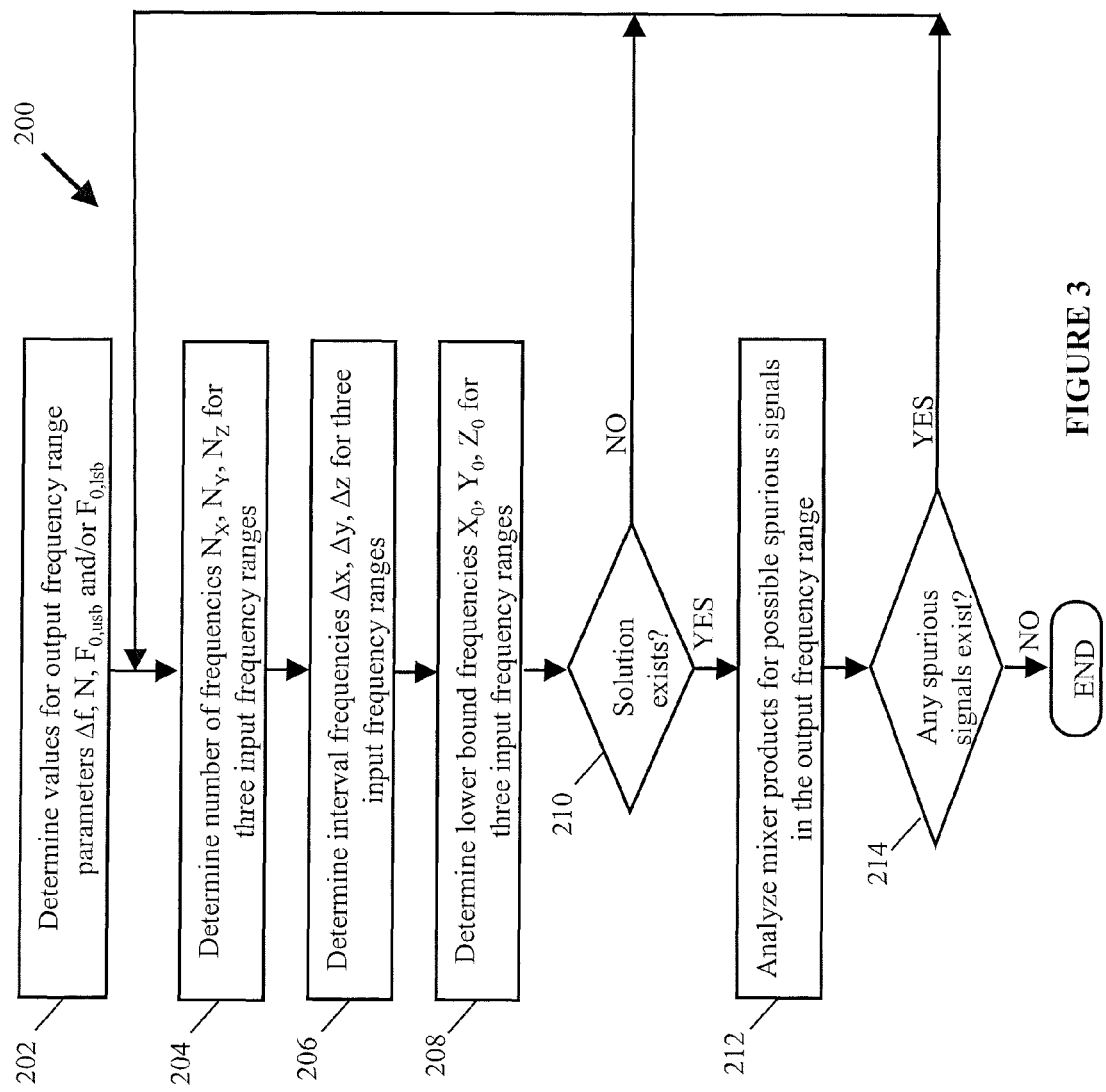
FIG. 3 is a flowchart of an example embodiment of a method for configuring a selectable local oscillator, such as that shown in FIG. 1 or 2, to produce a selectable frequency signal within a pre-determined output frequency range.

Reference is now made to FIG. 3, which shows a flowchart for an example embodiment of a configuration method 200 for configuring the selectable local oscillator 10 as shown in FIG. 1. The configuration method 200 begins at step 202 which includes specifying the parameters that describe the desired output frequency range of the selectable local oscillator 10. This can be done by setting the desired output frequency range to be the upper sideband range ($F_{0,usb}$, ..., $F_{N-1,usb}$) or the lower sideband range ($F_{0,lsb}$, ..., $F_{N-1,usb}$) and then specifying the frequency resolution Δf. If both of the lower and upper side bands are to be part of the desired output frequency range then alternative configurations, such as that shown in FIG. 2 for example, can be used for certain applications.

Step 204 comprises determining values for $N_X$, $N_Y$ and $N_Z$, corresponding to the numbers of frequencies in the frequency ranges of the signal generators 12 to 16 respectively. This determination can be made according to equation 3:

$$2\cdot N_X\cdot N_Y\cdot N_Z \geq N_F, \quad (3)$$

in which $N_F=(F_{N-1,usb}-F_{0,usb})/\Delta f$ for the upper sideband output frequency range and/or $N_F=(F_{N-1,usb}-F_{0,usb})/\Delta f$ for the lower sideband output frequency range. When equation 3 is satisfied as an equality, the actual output frequency range of the selectable local oscillator 10 will exactly match the desired output frequency range, but when equation 3 is satisfied as an inequality, then the actual output frequency range of the selectable oscillator 10 will have a wider range than the desired output frequency range. This means that some frequencies of the actual output frequency range of the selectable local oscillator 10 are not used. The unused range may be located at the beginning of the actual output frequency range or may be located at the end of the actual output frequency range or may be located both at the beginning and at the end of the actual output frequency range.

In step 204 one option can be to set $N_Y$ equal to $N_Z$. This allows for the use of the signal source 24 in the signal generator 14 to be coupled to a multiplier to get the required signals for the signal generator 16, or alternatively the use of the signal source 24 in the signal generator 14 coupled to a divider to get the required signals for the signal generator 12. Both of these cases allow for a lower cost implementation of the selectable local oscillator 10 and alternative embodiments incorporating these features are described in further detail below. Another option can be to set $N_x \geq N_y$ or $N_x \geq N_z$. Implementation of the selectable local oscillator 10 using a frequency divider and a frequency multiplier is discussed further below with reference to FIGS. 7 to 9.

Step 206 comprises determining values for the parameters $\Delta x$, $\Delta y$, $\Delta z$, which are the respective frequency resolution or frequency intervals of the frequency ranges Fx_range, Fy_range and Fz_range of the signal generators 12 to 16 respectively. This determination can be made according to equations 4a-4c:

$$\Delta x = \Delta f \quad (4a)$$

$$\Delta y = N_X \cdot \Delta x \quad (4b)$$

$$\Delta z = N_Y \cdot \Delta y. \quad (4c)$$

With this parameter setting, the frequency interval in the output frequency range of the selectable local oscillator 10, i.e. $\Delta f$, is set equal to the frequency interval used for the signal generator 12, i.e. $\Delta x$.

Step 208 comprises determining values for the parameters $X_o$, $Y_o$, $Z_o$, which are the respective lower bound frequencies of the frequency ranges of the signal generators 12 to 16. This determination can be made according to equations 5 to 9:

$$X_0 = \frac{(N_Z - 1) \cdot \Delta z + (N_Y - 1) \cdot \Delta y + \Delta x}{2} \quad (5)$$

$$F_{N-1,lsb} - \frac{3 \cdot (N_Z - 1) \cdot \Delta z + (N_Y - 1) \cdot \Delta y + (2 \cdot N_X - 1) \cdot \Delta x}{2} \leq (Z_0 - Y_0) \quad (6)$$

$$(Z_0 - Y_0) \leq F_{0,lsb} + \frac{(N_Z - 1) \cdot \Delta z + 3 \cdot (N_Y - 1) \cdot \Delta y + (2 \cdot N_X - 1) \cdot \Delta x}{2} \quad (7)$$

$$F_{N-1,usb} - \frac{3 \cdot (N_Z - 1) \cdot \Delta z + 3 \cdot (N_Y - 1) \cdot \Delta y + (2 \cdot N_X - 1) \cdot \Delta x}{2} \leq (Z_0 + Y_0) \quad (8)$$

$$(Z_0 + Y_0) \leq F_{0,usb} + \frac{(N_Z - 1) \cdot \Delta z + (N_Y - 1) \cdot \Delta y + (2 \cdot N_X - 1) \cdot \Delta x}{2} \quad (9)$$

As the value $X_0$ is completely fixed by the frequency intervals $\Delta x$, $\Delta y$ and $\Delta z$ and by the number of frequencies $N_y$ and $N_z$ according to equation 5, it will always be determinable. The determination of $Y_0$ and $Z_0$ that satisfy equations 6 and 7 or equations 8 and 9 may not always be possible based on the determinations of other parameters made in the previous steps 202 to 206. When equations 6 and 7 or equations 8 and 9 are not satisfied, then the decision 210 in this instance is negative which returns the configuration method 200 to step 204 for re-determination of the values of the configurable parameters. However, when equations 6 and 7 or equations 8 and 9 are satisfied, then the determined values of the input frequency range parameters constitute a possible configuration of the signal generators 12 to 16. Accordingly, the decision at step 210 in this instance advances the configuration method 200 to step 212, which can be optional in certain cases and is discussed in more detail below.

The method 200 can be modified for a selectable local oscillator 100 that produces two sidebands for the output frequency range by ensuring that both sets of equations 6 and 7, and 8 and 9 are satisfied.

Example Implementation

In the following example, the required output frequency range parameters of the desired selectable local oscillator are $\Delta f = 1$ MHz, $N = 54$, $F_{0,usb} = 3274$ MHz and $F_{0,lsb} = 1738$ MHz as per step 202 of the configuration method 200 in FIG. 3. Since both the upper sideband and the lower sideband output frequency ranges are specified, the selectable local oscillator 100 configuration described in FIG. 2 is used. In this example, $N_x$, $N_y$ and $N_z$ are chosen to be the same with a value of 3 as per step 204 in FIG. 3. Also the parameter values $\Delta x = 1$ MHz, $\Delta y = 3$ MHz and $\Delta z = 9$ MHz are determined as per step 206 in FIG. 3 as well as $X_o = 12.5$ MHz, $Y_o = 765$ MHz and $Z_o = 2523.5$ MHz as per step 206 in FIG. 3.

Referring now to FIGS. 4A-4D, shown therein are tables illustrating the intermediate and output frequency ranges for the example implementation of the selectable local oscillator 100 of FIG. 2. The signal generators 12 to 16 are configured according to the configuration method 200 to respectively provide frequency signals {12.5 MHz, 13.5 MHz and 14.5 MHz}, {765 MHz, 768 MHz and 771 MHz}, and {2523.5 MHz, 2532.5 MHz and 2541.5 MHz}. This configuration provides an output frequency range divided into a lower sideband frequency range F_lsb_range of 1738 MHz to 1791 MHz and an upper sideband frequency range F_usb_range of 3274 MHz to 3327 MHz with each sideband signals having a 1 MHz frequency interval or step spacing.

The columns in the tables of FIGS. 4A and 4B correspond to the outputs of the signal generators 12 to 16, and certain sidebands of the mixer 40 and the lower sideband of the mixer 50. The rows in the tables correspond to different combinations of selected frequency signals for the signal generators 12 to 16, the frequency selector 18 and the output stage 104 that results in a particular frequency within the lower sideband output frequency range. The lower sideband output frequency signal 116 in the frequency range F_lsb_range can be in the two frequency ranges F_bpf110_lsb_range and F_bpf108_lsb_range. Similarly, the columns in the tables of FIGS. 4C and 4D correspond to the outputs of the signal generators 12 to 16, and certain sidebands of the mixer 40 and the upper sideband of the mixer 50. The rows in the tables correspond to different combinations of selected frequency signals for the signal generators 12 to 16, the frequency selector 18 and the output stage 118 that results in a particular frequency within the upper sideband output frequency range. The upper sideband output frequency signal 114 in the frequency range F_usb_range can be in the two frequency ranges F_bpf122_usb_range and F_bpf120_usb_range.

For instance, selecting a frequency signal of 14.5 MHz for signal generator 12 (SG12) and a frequency signal of 771 MHz for signal generator 14 (SG14) results in a signal having a frequency of 785.5 MHz at the output of the mixer 40 in the frequency range F_bpf44_range (see the 1$^{st}$, 10$^{th}$ and 19$^{th}$ rows in FIG. 4A, the Lower Half of F_lsb_range Output Table) and a signal having a frequency of 756.5 MHz at the output of the mixer 40 in the frequency range F_bpf46_range (see the 3$^{rd}$, 12$^{th}$ and 21$^{st}$ rows in FIG. 4B, the Higher Half of F_lsb_range Output Table). If the output of the mixer 40 (i.e. frequency signal 785.5 MHz in F_bpf44_range) is selected by the frequency selector 18 and a frequency signal of 2523.5 MHz is selected for the signal generator 16 (SG16), the result is a signal having a frequency of 1738 MHz at the output of the mixer 50 in the frequency range F_bpf110_lsb_range (see the 1$^{st}$ row in FIG. 4A, the Lower Half of F_lsb_range Output Table) for the lower sideband output frequency signal 116 in the frequency range F_lsb_range of this implementation of the selectable local oscillator 100 of FIG. 2.

Scanning through the frequency signals of the signal generators 12 to 16 as shown in the FIG. 4A, the Lower Half of F_lsb_range Output Table and selecting the output of the mixer 40 in the frequency range F_bpf44_range and the output of the mixer 50 in the frequency range F_bpf110_lsb_range provides the 27 frequencies (i.e. 1738 MHz to 1764 MHz) in the lower sideband output frequency range F_lsb_range for this implementation of the selectable local oscillator 100 of FIG. 2. Furthermore, scanning through the frequency signals of the signal generators 12 to 16 as shown in the FIG. 4B, the Higher Half of F_lsb_range Output Table and selecting the output of the mixer 40 in the frequency range F_bpf46_range and the output of the mixer 50 in the frequency range F_bpf108_lsb_range provides the 27 frequencies (i.e. 1765 MHz to 1791 MHz) in the upper sideband output frequency range F_lsb_range for this implementation of the selectable local oscillator 100 of FIG. 2. It can be seen that there is a doubling in the output frequency range of the oscillator since using three frequency signals for each of the signal generators 12, 14 and 16 should result in only 27 output frequencies (i.e. 3×3×3=27). However, due to the use of both upper and lower sideband output signals of the mixer 40, there are a total of 54 frequencies in the entire output frequency range F_lsb_range (i.e. 1738 MHz to 1791 MHz with a 1 MHz spacing).

As another example, selecting a frequency signal of 14.5 MHz for the signal generator 12 (SG12) and a frequency signal of 765 MHz for the signal generator 14 (SG14) results in a signal having a frequency of 750.5 MHz at the output of the mixer 40 in the frequency range F_bpf46_range (see the 1$^{st}$, 10$^{th}$ and 19$^{th}$ rows in FIG. 4C, the Lower Half of F_usb_range Output Table) and a signal having a frequency of 779.5 MHz at the output of the mixer 40 in the output frequency range F_bpf44_range (see the 3$^{rd}$, 12$^{th}$ and 21$^{st}$ rows in FIG. 4D, the Higher Half of F_usb_range Output Table). If the 750.5 MHz output signal of the mixer 40 in the frequency range F_bpf46_range is selected by the frequency selector 18 and a frequency signal of 2523.5 MHz is selected for the signal generator 16 (SG16), the result is a signal having a frequency of 3274 MHz at the output of the mixer 50 in the frequency range F_bpf122_usb_range (see the 1$^{st}$ row in FIG. 4C, the Lower Half of F_usb_range Output Table) for the upper sideband output frequency range F_usb_range of this implementation of the selectable local oscillator 100 of FIG. 2.

Scanning through the frequency signals of the signal generators 12 to 16 as shown in FIG. 4C, the Lower Half of F_usb_range Output Table and selecting the output of the mixer 40 in the frequency range F_bpf46_range and the output of the mixer 50 in the frequency range F_bpf122_usb_range provides the 27 frequencies (i.e. 3274 MHz to 3300 MHz) in the upper sideband output frequency range F_usb_range for this implementation of the selectable local oscillator 100 of FIG. 2. Furthermore, scanning through the frequency signals of the signal generators 12 to 16 as shown in FIG. 4D, the Higher Half of F_usb_range Output Table, and selecting the output of the mixer 40 in the frequency range F_bpf44_range and the output of the mixer 50 in the frequency range F_bpf120_usb_range provides the 27 frequencies (i.e. 3301 MHz to 3327 MHz) in the upper sideband output frequency range F_usb_range for this implementation of the selectable local oscillator 100 of FIG. 2. Once again there is a doubling in the output frequency range of the oscillator since there are a total of 54 frequencies in the entire F_usb_range output frequency range (i.e. 3274 MHz to 3327 MHz with a 1 MHz spacing).

Spurious Analysis

As previously discussed, a mixer produces higher-order spurious frequency products according to equation 2. In conventional local oscillator designs, the mixers that are employed must have special requirements such that the undesirable higher-order spurious products have a low magnitude so that the output frequency signal is not noisy. For example, if the mixer 50 generates a higher-order spurious signal at n=2 and k=3, which occurs within the desired output frequency range of the selectable local oscillator 10, the mixer 50 is typically designed to meet a special requirement, i.e. the mixer is required to produce an acceptably low amplitude mixer product level for the n=2 and k=3 spurious mixer product for certain input signal amplitudes if no other actions are taken to minimize the effect of the spurious signal. Alternatively, the local selectable oscillator 10 can be designed, as described herein, such that the n=2 and k=3 spurious mixer product is at a frequency that does not interfere with the desired output frequency range.

Referring once again to FIG. 3, step 212 is an optional step and comprises analyzing whether the present configuration of the signal generators 12 to 16, determined according to previous steps 204 to 208, will result in mixers 40 and 50 that produce spurious mixer product signals with frequencies outside the desired output frequency range of the selectable local oscillator. The desirable products of the mixers 40 and 50 are the first order products that occur for n=k=1 in equation 2. Accordingly, the spurious mixer products are mixer product components in which n or k has a value that is not equal to 1. These spurious mixer products cannot generally be reduced through filtering and can exist as noise in the output frequency range of the selectable local oscillator if the selectable local oscillator is not configured properly. However, there are situations in which these spurious mixer products can be reduced by filtering if certain filtering strategies are used in the output stage of the selectable local oscillator as explained in further detail below. Analysis of spurious mixer product frequencies can be facilitated using programs or algorithms, implemented for example as software, that can check whether spurious mixer products are in the output frequency range of the selectable local oscillator for a given configuration of the frequencies that are provided by the signal generators 12 to 16. This program can operate in accordance with steps 212 and 214 as described herein. The analysis of the spurious frequencies is performed with respect to both the mixer 40 and mixer 50 separately. For alternative embodiments in which additional mixers are used, the analysis can be done for the additional mixers. The analysis can also be done graphically or with a spreadsheet program to show if undesirable harmonic mixer products are in the output frequency range of the selectable local oscillator. Those skilled in the art can generate the program or spreadsheet based on the information provided herein.

Figure 5A:
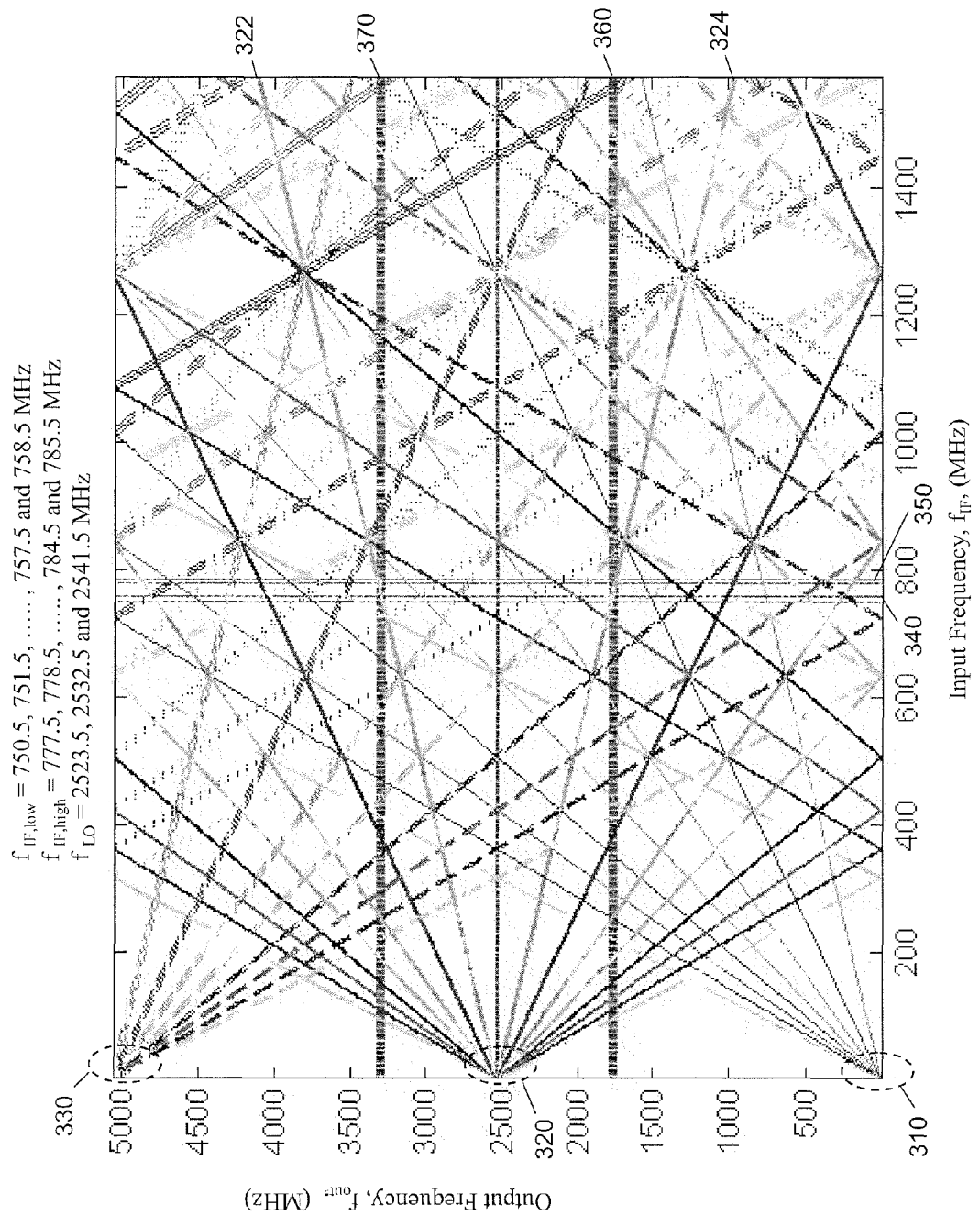
FIGS. 5A to 5C are graphs showing example output frequency ranges that avoid undesirable spurious mixer products.
Figure 5B:
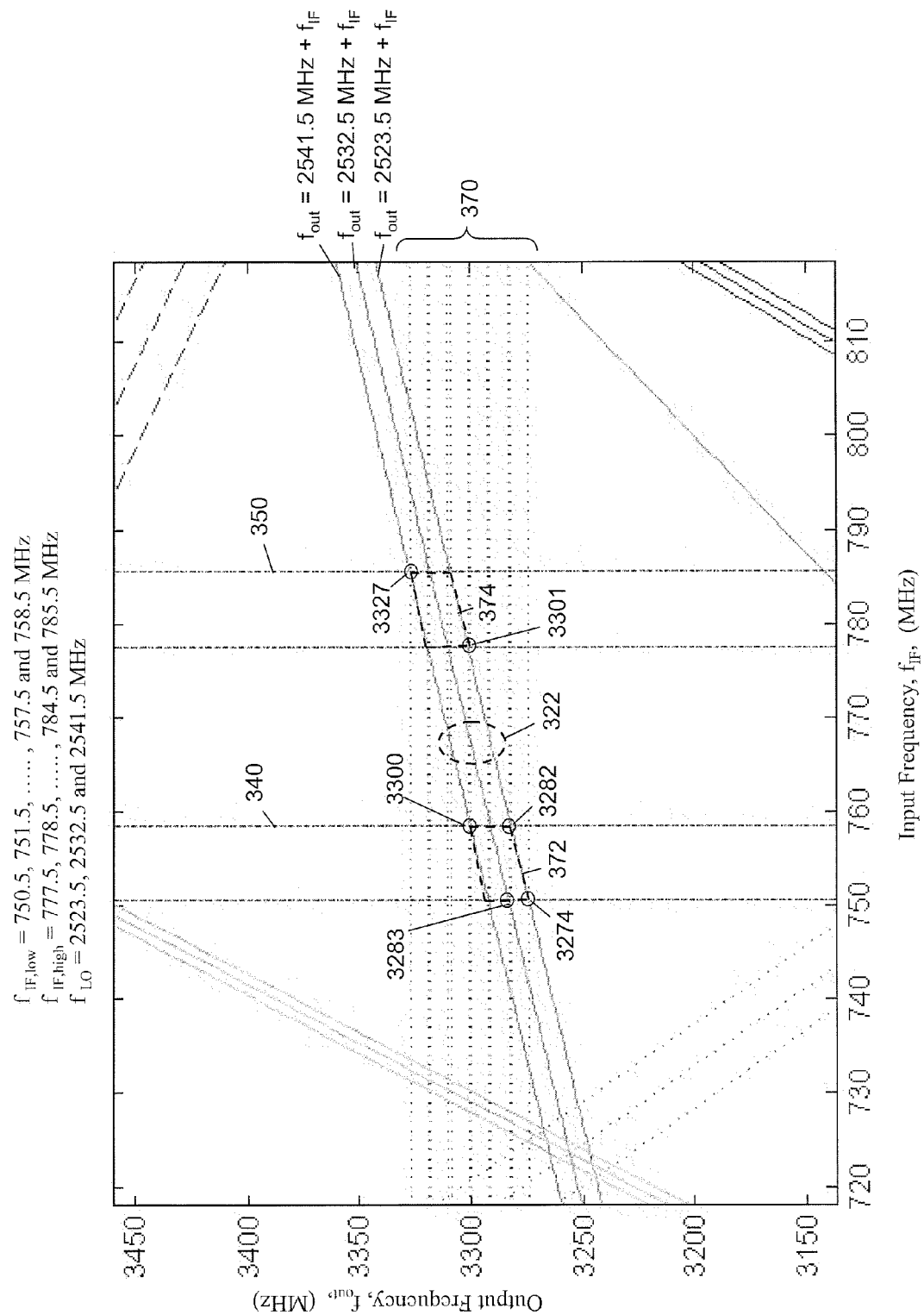
Figure 5C:
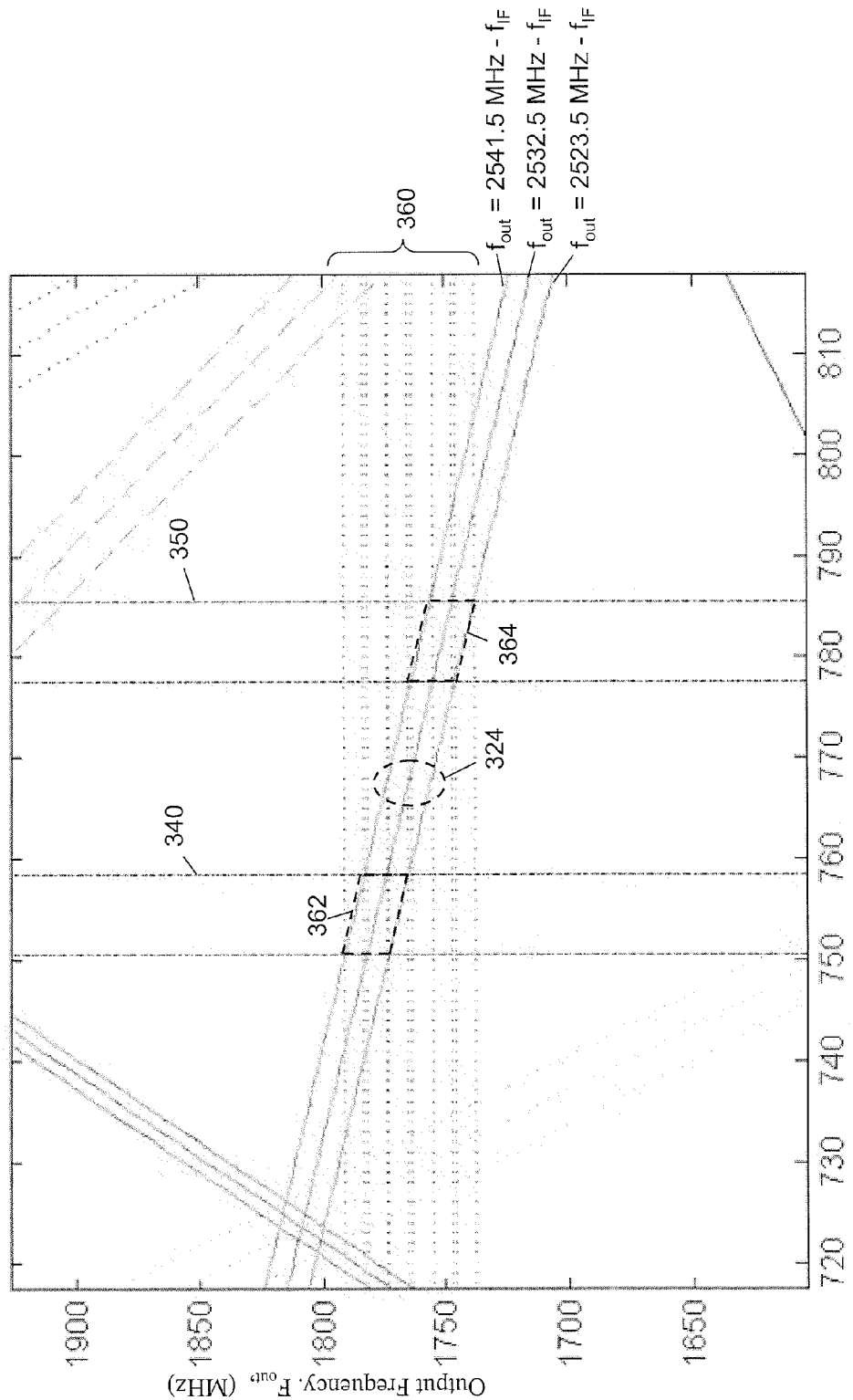

Reference is now made to FIGS. 5A, 5B and 5C, in which, for example, possible mixer products of the mixer 50 are graphed based on various mixer combinations of the output frequency signal of the frequency selector 18 and the output frequency signal of the signal generator 16 for an example implementation. Each line (i.e. graphed line) in FIGS. 5A-5C represents a particular solution of equation 2 for some values of n and k, represented below as:

$$f_{OUT}=|n \cdot f_{LO} \pm k \cdot f_{IF}|, n,k=\text{Positive Integer}, \quad (10)$$

where the output frequency $f_{OUT}$ corresponds to the output of the mixer 50 and is plotted on the y-axis, the input frequency ($f_{IF}$) corresponds to the output of frequency selector 18 and is plotted on the x-axis, and the local oscillator frequency ($f_{LO}$) corresponds to the output of signal generator 16 and is held as a constant for each frequency that the signal generator 16 can provide.

In FIG. 5A, reference numerals are shown designating only a portion of the entire lines that they represent. In FIG. 5A, the family of lines 310, which start at the origin of the plot, represents output frequencies $f=k \cdot f_{IF}$ for different integer values of k. The family of lines 320 represents output frequencies $f=|f_{LO} \pm k \cdot f_{IF}|$ for different integer values of k. The family of lines 330 represents output frequencies $f=|2 \cdot f_{LO} \pm k \cdot f_{IF}|$ for different integer values of k and so on.

Within the family of lines 320, lines 322 specifically represent output frequency $f=|f_{LO}+f_{IF}|$ and lines 324 specifically represent output frequency $f=|f_{LO}-f_{IF}|$, for different values of $f_{LO}$ and $f_{IF}$, for example, as specified in FIGS. 5A-5C. These output frequencies are the desired first order mixer products of the mixer 50. All of the other lines in FIG. 5A therefore represent spurious mixer products. The lines 322 and 324 are themselves a family of lines to represent different possible frequencies within the output frequency range.

In particular, FIGS. 5A-5C show graphs illustrating the output frequency signals for the example implementation of the selectable local oscillator 100 of FIG. 2 and FIGS. 4A-4D. In FIG. 5A, the bandwidths 340 and 350 represent possible ranges of input frequencies for the mixer 50 that correspond to the lower sideband frequency range F_bpf46_range and the upper sideband frequency range F_bpf44_range generated by the mixer 40. Likewise, the bandwidths 360 and 370 correspond to the lower sideband frequency range F_lsb_range and the upper sideband frequency range F_usb_range of the selectable local oscillator of FIG. 2.

FIG. 5B is a magnified version of FIG. 5A that focuses on the frequency ranges 340, 350 and 370. The regions 372 and 374 define the intersection of the desired mixer products 322 and the frequency ranges 340 and 350. The frequency region 372 corresponds to the first 27 frequencies, i.e. 3274 MHz to 3300 MHz, with a step size of 1 MHz in the upper sideband output frequency range F_usb_range for this example implementation of the selectable local oscillator 100 of FIG. 2. Similarly, the frequency region 374 corresponds to the last 27 frequencies, i.e. 3301 MHz to 3327 MHz, with a step size of 1 MHz in the upper sideband output frequency range F_usb_range for this example implementation of the selectable local oscillator 100 of FIG. 2.

For instance, in FIG. 5B, the intersection of the lowest frequency of the frequency range 340, i.e. 750.5 MHz, and the lowest LO frequency of the family of lines 322, i.e. $f_{out}=2523.5+f_{IF}$, is the lowest required output frequency 3274 MHz (see the 1$^{st}$ row of the last three columns in FIG. 4C, the Lower Half of F_usb_range Output Table). The intersection of the second lowest frequency in the frequency range 340, i.e. 751.5 MHz, and the lowest LO frequency of the family of lines 322, i.e. $f_{out}=2523.5+f_{IF}$, is the second lowest required output frequency 3275 MHz (see the 2$^{nd}$ row of the last three columns in FIG. 4C) and so on until the intersection of the highest frequency in the frequency range 340, i.e. 758.5 MHz and the lowest LO frequency of the family lines 322, i.e. $f_{out}=2523.5+f_{IF}$, is the required output frequency, 3282 MHz (see the 9$^{th}$ row of the last three columns in FIG. 4C). The next higher required output frequency, 3283 MHz, is the intersection of the lowest frequency of the frequency range 340, i.e. 750.5 MHz, and the middle LO frequency of the family of lines 322, i.e. $f_{out}=2532.5+f_{IF}$, (see the 10$^{th}$ row of the last three columns in FIG. 4C) and so on to the highest frequency of the region 372, i.e. the highest frequency of the Lower Half of the upper sideband range F_usb_range, 3300 MHz, which is the intersection of the highest frequency of the frequency range 340, i.e. 758.5 MHz, and the highest LO frequency of the family of lines 322, i.e. $f_{out}=2541.5+f_{IF}$, (see the last row of the last three columns in FIG. 4C).

The lowest frequency 3301 MHz of the Higher Half of the upper sideband of the output frequency range F_usb_range is located in the frequency region 374 and is the intersection of the lowest frequency of the frequency range 350, i.e. 777.5 MHz, and the lowest LO frequency of the family of lines 322, i.e. $f_{out}=2523.5+f_{IF}$, (see the 1$^{st}$ row of the last three columns in FIG. 4D, the Higher Half of F_usb_range Output Table). Note that the interval between the highest frequency of the region 372, i.e. the highest frequency of the Lower Half of F_usb_range, and the lowest frequency of the region 374, i.e. the lowest frequency of the Higher Half of F_usb_range, is exactly the required output frequency step size of 1 MHz. This is mainly due to the selection of the $X_o$ value, i.e. 12.5 MHz, as per the equation 5 in Step 206 of FIG. 3. Similarly as above, the highest frequency of the Higher Half of F_usb_range, 3327 MHz, is the intersection of the highest frequency of the frequency range 350, i.e. 785.5 MHz, and the highest LO frequency of the family of lines 322, i.e. $f_{out}=2541.5+f_{IF}$, (see the last row of the last three columns in FIG. 4D).

FIG. 5C is a magnified version of FIG. 5A that focuses on the frequency ranges 340, 350 and 360. The regions 362 and 364 define the intersection of the desired mixer products 324 and the frequency ranges 340 and 350. The frequency region 364 corresponds to the first 27 frequencies (i.e. 1738 MHz to 1764 MHz) with a step size of 1 MHz in the lower sideband output frequency range F_lsb_range for this implementation of the selectable local oscillator 100 of FIG. 2. Similarly, the frequency region 362 corresponds to the last 27 frequencies (i.e. 1765 MHz to 1791 MHz) with a step size of 1 MHz in the lower sideband output frequency range F_lsb_range for this implementation of the selectable local oscillator 100 of FIG. 2.

As can be seen in FIG. 5B, since none of the lines corresponding to spurious mixer products intersect the regions 372 and 374, the output frequency range of the selectable local oscillator 100 of FIG. 2 that only includes regions 372 and 374 will contain no spurious mixer products. Also as can be seen in FIG. 5C, since none of the lines corresponding to spurious mixer products intersect the regions 362 and 364, the output frequency range of the selectable local oscillator 100 of FIG. 2 that only includes regions 362 and 364 will contain no spurious mixer products. In addition, with respect to FIGS. 5B and 5C, it should be noted that since the input signal to the second mixer stage (i.e. mixer 50) can be provided by both of the upper sideband and lower sideband output of the frequency selector 18, the result is a doubling in the output frequency range of the selectable local oscillator 100 when compared with a traditional design approach. The doubling in the output frequency range results because the output frequency range consists of both frequency regions 372 and 374 for F_usb_range and also of both frequency regions 362 and 364 for F_lsb_range.

Referring once again to FIG. 3, analysis of spurious mixer product signals may reveal that the present configuration of the signal generators 12 to 16 causes undesirable spurious mixer product signals to be present in the output frequency range of the selectable local oscillator. When undesirable spurious mixer products are present, the decision step 214 in this instance returns the configuration method 200 to step 204 to reselect values for the parameters, discussed previously, of the signal generators 12 to 16. Alternatively, in the event that it is determined at step 214 that undesirable spurious mixer products are not present in the output frequency range of the selectable local oscillator, then the selected values of the input frequency range parameters constitute a possible configuration of the signal generators 12 to 16. Accordingly, the decision step 214 in this instance results in the end of the configuration method 200.

A program can be used to determine if there are spurious mixer product signals in the output frequency range. The program starts with an initial selection of frequencies for the signal generators, and then calculates the various spurious mixer product signals, using equation 10 for instance, up to a certain order (i.e. the order is defined by the addition of integers n and k in equation 10). For example, the possible pairs are (n=8, k=0), (n=7, k=1), (n=1, k=7) and so on for the $8^{th}$ order. The program then determines if there are any spurious mixer product signals in the desired output frequency range and if so then iteratively selects different signal parameters so that there are no spurious mixer products in the desired output frequency range. Additional information can be provided to the program such as the expected amplitude of the spurious mixer product signals, which depends on the hardware that is used. This information can be used as described below.

It should be noted that the undesirable spurious mixer products are those spurious mixer products that have a signal level that adversely affects signal quality with respect to a specified signal quality level. Accordingly, it may be possible to allow certain spurious mixer products to exist in the output frequency range of the selectable local oscillator. These allowable spurious mixer products are those that have a level less than a specified threshold such as −90 dBc for example. This level is approximately higher than that of an $8^{th}$ order spurious mixer product. Accordingly, when trying to address undesirable spurious mixer products either graphically or with a program, as described above, one does not have to examine spurious mixer products above a certain order that have a lower magnitude than the specified threshold.

Additional Example Embodiments

As mentioned previously, analysis of spurious mixer product signals may reveal that the selected configuration of the signal generators 12 to 16 causes undesirable spurious mixer product signals to be present in the output frequency range of the selectable local oscillator. When undesirable spurious mixer products are present in the output frequency range, according to the decision step 214 of FIG. 3, the configuration method 200 returns to step 204 to reselect values for the parameters of the signal generators 12 to 16; however there may be no possible solution for the embodiment of the selectable oscillator. In this case, an additional mixer stage can be included in the second signal generator to provide more options for the output frequency range of the mixer 40 in order to improve the chance of obtaining the required design solution without any spurious mixer products present in the output frequency range. Similarly, an additional mixer stage can be included in the third signal generator to provide more options for the output frequency range of the mixer 50.

Figure 6:
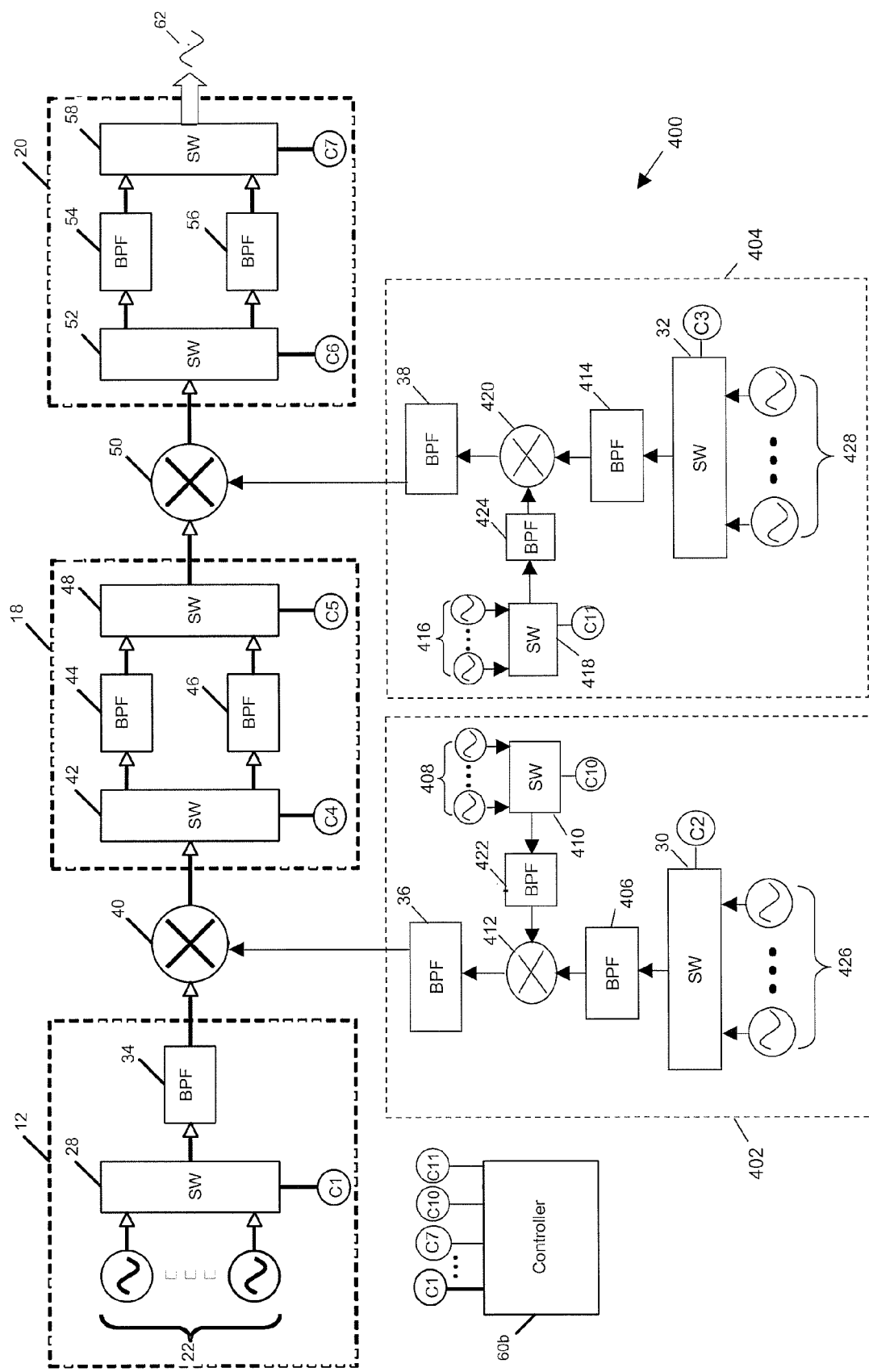
FIG. 6 is a block diagram of an example embodiment of another selectable local oscillator that can produce an output frequency signal having a selectable frequency within a desired output frequency range.

Referring now to FIG. 6, shown therein is a block diagram of an example embodiment of another selectable local oscillator 400 that can produce an output frequency signal having a selectable frequency within a desired output frequency range. The selectable local oscillator 400 has the same general topology as the selectable local oscillator 10 except for the signal generators 402 and 404, which are functionally similar yet structurally different than the signal generators 14 and 16 (i.e. signal generators 402 and 14 have the same output frequency range Fy_range and signal generators 404 and 16 have the same output frequency range Fz_range). Both of the signal generators 402 and 404 use topologies such that lower signal source frequency signals are mixed or frequency translated to the higher frequency signals that are required for producing the desired output frequency range. Accordingly, both the signal generators 402 and 404 use mixers to mix frequency signals from two different sets of frequency signals to generate the second and third selected frequency signals. The signal generator 402 is introduced to provide more options for the output frequency range of the mixer 40 in order to improve the chance of obtaining a design solution such that undesirable spurious mixer products are not present in the output frequency range of the selectable local oscillator 400 as mentioned briefly before. The signal generator 404 is also introduced to provide more options for the output frequency range of the mixer 50 in order to improve the chance of obtaining a possible configuration to satisfy equations 6 and 7 and/or equations 8 and 9. In addition, the use of both signal generators 402 and 404 provides a lower cost in production as discuss in detail later.

The signal generator 402 includes signal source 426, the switch 30, a filter 406, additional signal source 408, a switch 410, a filter 422, a mixer 412 and the filter 36. In a likewise fashion, the signal generator 404 includes signal source 428, the switch 32, a filter 414, additional signal source 416, a switch 418, a filter 424, a mixer 420 and the filter 38. Extra control signals C10 and C11 are provided for the signal generators 402 and 404 respectively for the additional switch that each of these generators contains. It should be noted that there can be instances in which the signal sources 408 and/or 416 only provide one frequency signal in which case the corresponding switch 410 and/or 418 is not required and the corresponding filters 422 and/or 424 may also not be required depending on the signal quality of the additional signal sources 408 and 416. The signal generators 402 and 404 operate in a generally similar manner so only the operation of the signal generator 402 will be discussed.

The signal source 426 provides a first range of frequency signals, one of which is selected by the switch 30 according to the control signal C2. The output of the switch 30 is filtered by the filter 406 to remove extraneous signals and noise (it should be noted that the term "extraneous signals" used herein is meant to include spurious signals). The signal source 408 generally provides a second range of frequency signals, one of which is selected by the switch 410 according to the control signal C10. The output of the switch 410 is filtered by the filter 422 to remove extraneous signals and noise and then mixed with the output of the filter 406 up to the required frequency in the frequency range Fy_range. The filter 406 can be a bandpass filter with a passband that is large enough to pass the frequencies generated by the signal source 426. However, the filter 406 may be a low pass filter in certain cases provided that there are no sub-harmonics or other low frequency noise. The filter 36 is generally a band pass filter with a passband selected to pass frequencies in the frequency range Fy_range.

Accordingly, in the selectable local oscillator 400, the signal source 408, switch 410, filter 422 and mixer 412 provide a first frequency offset mixer stage within the signal generator 402 and the signal sources 416, switch 418, filter 424 and mixer 420 provide a second frequency offset mixer stage within the signal generator 404. Both of the frequency offset mixer stages allow lower signals to be generated by the signal sources 426 and 428 while satisfying the frequency requirements of frequency ranges Fy_range and Fz_range.

It will be appreciated how method 200 for configuring selectable local oscillator 10 as shown in FIG. 1 can, with suitable modification, be adapted also for configuring selectable local oscillator 400. For example, step 208 comprises determining values for parameters $Y_0$ and $Z_0$ by satisfying at least one of equations 6 and 7 or equations 8 and 9. The determined parameters $Y_0$ and $Z_0$ are used in the specification of input frequency ranges Fy_range and Fz_range for signal generators 402 and 404.

In selectable local oscillator 10, Fy_range and Fz_range are provided by signal generators 14 and 16 using signal sources 24 and 26. However, in selectable local oscillator 400, Fy_range and Fz_range are provided using additional signal sources 408 and 416, respectively. Thus, for configuring selectable local oscillator 400, method 200 may be modified by including an additional step after decision 210 in which are determined the signal sources 426 and 408 of signal generator 402. This determination may be made by taking Fy_range to be the upper (or lower) sideband of the mixed signal product outputted by mixer 412. By selecting a given frequency signal for signal source 408, suitable frequency signals for signal source 426 can then be determined such that signal generator 402 will provide the desired input frequency range Fy_range. Filter 36 can be configured to pass either the upper or lower sideband of the mixed signal product output by mixer 412 as the case may be. Also as part of the additional step, signal generator 404 can be similarly configured by selecting a given frequency signal for signal source 416 and then determining suitable frequency signals for signal source 428 such that the upper (or lower) sideband of the mixed signal product outputted by mixer 420 will be the desired input frequency range Fz_range.

Using the modified version of method 200, selectable local oscillator 400 can be configured to provide the same output frequency range as selectable local oscillator 10. For example, for achieving the same output frequency range as in the example implementation presented in FIGS. 4A-4D, in the selectable local oscillator 400, the signal source 22 provides frequency signals having frequencies 12.5 MHz, 13.5 MHz and 14.5 MHz for Fx_range as before. However, the signal source 426 now provides frequency signals having frequencies of 37.5 MHz, 40.5 MHz and 43.5 MHz, and the signal source 408 provides a frequency signal having a frequency of 727.5 MHz (or 808.5 MHz). Mixing these two groups of frequency signals together and taking the upper (or lower) sideband results in 765 MHz, 768 MHz and 771 MHz for the frequency range Fy_range as specified for the example of FIGS. 4A-4D. Likewise, the signal source 428 now provides frequency signals having frequencies of 112.5 MHz, 121.5 MHz and 130.5 MHz, and the signal source 416 provides a frequency signal having a frequency of 2411 MHz (or 2654 MHz). Mixing these two groups of frequencies together and taking the upper (or lower) sideband results in 2523.5 MHz, 2532.5 MHz and 2541.5 MHz for the frequency range Fz_range as specified for the example of FIGS. 4A-4D. The end result is the same output frequency ranges of 1738 MHz to 1791 MHz with a 1 MHz spacing or 3274 MHz to 3327 MHz with a 1 MHz spacing.

Further features of the selectable local oscillator 400 in FIG. 6 are described herein. Referring to FIGS. 4A and 4D, F_bpf44_range is the frequency range for the upper sideband output of the mixer 40, i.e. M40=SG14+SG12 (see the 4$^{th}$ column of FIG. 4A, the Lower Half of F_lsb_range Output Table, and of FIG. 4D, the Higher Half of F_usb_range Output Table). Also referring to FIGS. 4B and 4C, F_bpf46_range is the frequency range for the lower sideband output of the mixer 40, i.e. M40=SG14−SG12 (see the 4$^{th}$ column of FIG. 4B, the Higher Half of F_lsb_range Output Table, and of FIG. 4C, the Lower Half of F_usb_range Output Table). SG12 is a frequency signal of the signal generator 12 in the frequency range Fx_range and SG14 is a frequency signal of the signal generator 14 in the frequency range Fy_range. The signal generator 14, in both the selectable oscillator 10 of FIG. 1 and the selectable oscillator 100 of FIG. 2, provides only one frequency range, i.e. Fy_range. However, the signal generator 402 of the selectable local oscillator 400 of FIG. 6 has two output frequency ranges, which are the upper sideband Fy_usb_range and lower sideband Fy_lsb_range output signals of the mixer 412. Accordingly, in the selectable oscillator 400 of FIG. 6, the frequency ranges F_bpf44_range and F_bpf46_range may be Fy_usb_range+Fx_range or Fy_lsb_range+Fx_range or Fy_usb_range−Fx_range or Fy_lsb_range−Fx_range. There are a total of 6 different configurations for the frequency selector 18 in the selectable oscillator 400 of FIG. 6 as shown in Table 1 below.

Similarly referring to FIGS. 4A and 4B, the frequency range F_lsb_range is the lower sideband output of the mixer 50, i.e. M50=SG16−M40 (see the last column of FIG. 4A, the Lower Half of F_lsb_range Output Table, and of FIG. 4B, the Higher Half of F_lsb_range Output Table). Also referring to FIGS. 4C and 4D, the frequency range F_usb_range is the upper sideband output of the mixer 50, i.e. M50=SG16+M40 (see the last column of FIG. 4C, the Lower Half of F_usb_range Output Table, and of FIG. 4D, the Higher Half of F_usb_range Output Table). M40 is the output frequency signal of the mixer 40 which is in the frequency range F_bpf44_range or the frequency range F_bpf46_range and SG16 is a frequency signal in the frequency range Fz_range of the signal generator 16. The signal generator 16, in both the selectable oscillator 10 of FIG. 1 and the selectable oscillator 100 of FIG. 2, provides only one output frequency range, i.e. Fz_range. However, the signal generator 404 of the selectable local oscillator 400 of FIG. 6 has two output frequency ranges which are the upper sideband Fz_usb_range and lower sideband Fz_lsb_range for the different output signals produced by the mixer 420. Accordingly, for the selectable oscillator 400 of FIG. 6, F_lsb_range may be provided by one of two output frequency ranges, i.e. F_lsb_range=Fz_usb_range−M40 or Fz_lsb_range−M40 and also F_usb_range may be provided by one of two output frequency ranges, i.e. F_usb_range=Fz_usb_range+M40 or Fz_lsb_range+M40. Since there are possible 6 different configurations for the frequency selector 18 in the selectable oscillator 400 of FIG. 6, the lower sideband output frequency range F_lsb_range may be provided by a total of 12 possible configurations as shown in Table 2 and the upper sideband output frequency range F_usb_range may be provided by a total of 12 possible configurations as shown in Table 3. Note that in all 16 different configurations, the output frequency range of the selectable oscillator 400 of FIG. 6 can be either the lower sideband signal of M50 (i.e. F_lsb_range=F_bpf56_lsb_range+

F_bpf54_lsb_range) or the upper sideband signal of M50 (i.e. F_usb_range=F_bpf56_usb_range+F_bpf54_usb_range).

TABLE 1

| Case | F_bpf44_range | F_bpf46_range |
|------|---------------|---------------|
| 1 | Fy_usb_range + Fx_range | Fy_usb_range − Fx_range |
| 2 | Fy_usb_range + Fx_range | Fy_lsb_range + Fx_range |
| 3 | Fy_usb_range + Fx_range | Fy_lsb_range − Fx_range |
| 4 | Fy_usb_range − Fx_range | Fy_lsb_range + Fx_range |
| 5 | Fy_usb_range − Fx_range | Fy_lsb_range − Fx_range |
| 6 | Fy_lsb_range + Fx_range | Fy_lsb_range − Fx_range |

TABLE 2

| Case | F_bpf110_lsb_range | F_bpf108_lsb_range |
|------|--------------------|--------------------|
| 1.u | Fz_usb_range − (Fy_usb_range + Fx_range) | Fz_usb_range − (Fy_usb_range − Fx_range) |
| 1.l | Fz_lsb_range − (Fy_usb_range + Fx_range) | Fz_lsb_range − (Fy_usb_range − Fx_range) |
| 2.u | Fz_usb_range − (Fy_usb_range + Fx_range) | Fz_usb_range − (Fy_lsb_range + Fx_range) |
| 2.l | Fz_lsb_range − (Fy_usb_range + Fx_range) | Fz_lsb_range − (Fy_lsb_range + Fx_range) |
| 3.u | Fz_usb_range − (Fy_usb_range + Fx_range) | Fz_usb_range − (Fy_lsb_range − Fx_range) |
| 3.l | Fz_lsb_range − (Fy_usb_range + Fx_range) | Fz_lsb_range − (Fy_lsb_range − Fx_range) |
| 4.u | Fz_usb_range − (Fy_usb_range − Fx_range) | Fz_usb_range − (Fy_lsb_range + Fx_range) |
| 4.l | Fz_lsb_range − (Fy_usb_range − Fx_range) | Fz_lsb_range − (Fy_lsb_range + Fx_range) |
| 5.u | Fz_usb_range − (Fy_usb_range − Fx_range) | Fz_usb_range − (Fy_lsb_range − Fx_range) |
| 5.l | Fz_lsb_range − (Fy_usb_range − Fx_range) | Fz_lsb_range − (Fy_lsb_range − Fx_range) |
| 6.u | Fz_usb_range − (Fy_lsb_range + Fx_range) | Fz_usb_range − (Fy_lsb_range − Fx_range) |
| 6.l | Fz_lsb_range − (Fy_lsb_range + Fx_range) | Fz_lsb_range − (Fy_lsb_range − Fx_range) |

TABLE 3

| Case | F_bpf122_lsb_range | F_bpf120_lsb_range |
|------|--------------------|--------------------|
| 1.u | Fz_usb_range + (Fy_usb_range + Fx_range) | Fz_usb_range + (Fy_usb_range − Fx_range) |
| 1.l | Fz_lsb_range + (Fy_usb_range + Fx_range) | Fz_lsb_range + (Fy_usb_range − Fx_range) |
| 2.u | Fz_usb_range + (Fy_usb_range + Fx_range) | Fz_usb_range + (Fy_lsb_range + Fx_range) |
| 2.l | Fz_lsb_range + (Fy_usb_range + Fx_range) | Fz_lsb_range + (Fy_lsb_range + Fx_range) |
| 3.u | Fz_usb_range + (Fy_usb_range + Fx_range) | Fz_usb_range + (Fy_lsb_range − Fx_range) |
| 3.l | Fz_lsb_range + (Fy_usb_range + Fx_range) | Fz_lsb_range + (Fy_lsb_range − Fx_range) |
| 4.u | Fz_usb_range + (Fy_usb_range − Fx_range) | Fz_usb_range + (Fy_lsb_range + Fx_range) |
| 4.l | Fz_lsb_range + (Fy_usb_range − Fx_range) | Fz_lsb_range + (Fy_lsb_range + Fx_range) |
| 5.u | Fz_usb_range + (Fy_usb_range − Fx_range) | Fz_usb_range + (Fy_lsb_range − Fx_range) |
| 5.l | Fz_lsb_range + (Fy_usb_range − Fx_range) | Fz_lsb_range + (Fy_lsb_range − Fx_range) |
| 6.u | Fz_usb_range + (Fy_lsb_range + Fx_range) | Fz_usb_range + (Fy_lsb_range − Fx_range) |
| 6.l | Fz_lsb_range + (Fy_lsb_range + Fx_range) | Fz_lsb_range + (Fy_lsb_range − Fx_range) |

Figure 7:
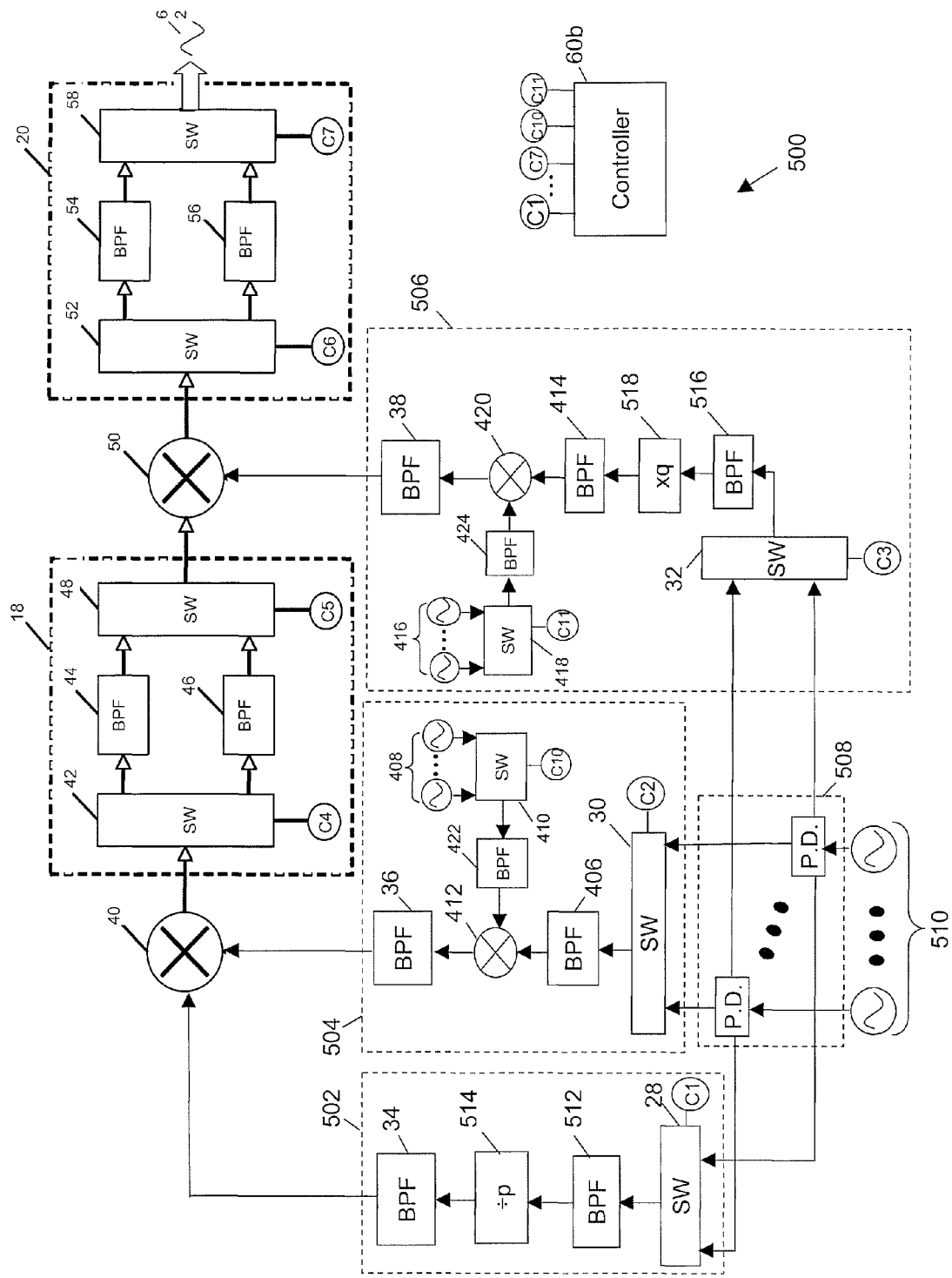
FIG. 7 is a block diagram of an example embodiment of another selectable local oscillator that can produce an output frequency signal having a selectable frequency within a desired output frequency range.

Referring now to FIG. 7, shown therein is a block diagram of an example embodiment of another selectable local oscillator 500 that can produce an output frequency signal having a selectable frequency within a desired output frequency range. The selectable local oscillator 500 includes signal generators 502, 504 and 506 that use a common signal source 510 and common power dividers 508 as well as a frequency divider or a frequency multiplier as needed to produce the required frequency signals. Accordingly, the common signal source 510 provides a common set of frequency signals to the first, second and third signal generators 502, 504 and 506. A frequency divider 514 is used for dividing a selected frequency signal when generating the first selectable frequency signal, and a frequency multiplier 518 is used for multiplying a selected frequency signal when generating the third selectable frequency signal.

The common signal source 510 and common power dividers 508 provide the common frequency signals to the signal generators 502, 504 and 506. The number of common power dividers is the same as the number of frequency signals provided by the common signal source 510. There can be a larger or smaller number of common signal sources and common power dividers depending on the desired output frequency range. This embodiment has a lower implementation cost because of the reduction of required signal sources as well as the fact that frequency multipliers and frequency dividers generally have a lower production cost than signal sources such as crystal oscillators.

The signal generator 502 includes the switch 28, filter 512, frequency divider 514 and filter 34. The switch 28 receives the frequency signals from the common signal source 510 and selects one of the frequency signals. In alternative embodiments, the signal generator 502 may not use each frequency signal provided by the common signal source 510. The selected frequency signal is filtered by the filter 512. The filter 512 has a passband to remove noise and extraneous signals in the selected frequency signal. The frequency divider 514 then applies frequency division by a factor of p to reduce the frequency of the filtered signal. The filter 34 then filters the frequency divided signal. The filter 34 has a passband to remove noise and extraneous signals. The signal generator 502 provides frequency signals with frequencies in the frequency range of Fx_range. Accordingly, due to the frequency division, the common signal source 510 provides frequencies that are larger than those in the frequency range Fx_range.

The signal generator 504 has similar features to the signal generator 402 except that the signal sources 426 have been replaced by the common signal source 510. Accordingly, the operation of the signal generator 504 is similar to the signal generator 402. The signal generator 504 provides frequency signals with frequencies in the frequency range Fy_lsb_range and Fy_usb_range. Also, in alternative embodiments, the signal generator 504 may not use each frequency signal provided by the common signal source 510.

The signal generator 506 is similar to a combination of the signal generators 404 and 502. The signal generator 506 includes the switch 32, filter 516, frequency multiplier 518, filter 414, signal sources 416, switch 418, filter 424, mixer 420 and filter 38. The switch 32 receives the frequency signals from the common signal source 510 and selects one of the frequency signals. In alternative embodiments, the signal generator 506 may not use each frequency signal provided by the common signal source 510. The selected frequency signal is filtered by the filter 516. The filter 516 has a passband to allow the selected frequency and remove noise and extraneous signals. The frequency multiplier 518 then applies frequency multiplication by a factor of q to increase the frequency of the filtered signal. The frequency multiplication factor q can be different than the frequency division factor p. The filter 414 then filters the frequency-multiplied signal. The filter 414 has a passband to remove noise and spurious signals in the frequency-multiplied signal. At this point, the signal generator 506 operates similarly to the signal generator 404. The signal generator 506 provides frequency signals with frequencies in the frequency range of Fz_lsb_range and Fz_usb_range. Accordingly, due to the frequency multiplication, the common signal source 510 provides frequency signals with frequencies that are smaller than those in the frequency range Fz_range.

It will be appreciated how method 200 for configuring selectable local oscillator 10 as shown in FIG. 1 can, with suitable modification, be adapted also for configuring selectable local oscillator 400. Specifically, in step 204, the number of input frequencies $N_x$, $N_y$, and $N_z$ for input frequency ranges Fx_range, Fy_range and Fz_range, respectively, can be chosen all to be the number of frequency signals in the signal source 510. Then in step 208, the lower bound frequencies $Y_0$ and $Z_0$ can be determined, according to equations 6 to 9, such that $Y_0$ is proportional to $X_0$ by the division factor 514 and $Z_0$ is proportional to $Y_0$ by the multiplication factor 518. When $Y_0$ and $Z_0$ can be so determined, input frequency ranges Fx_range, Fy_range and Fz_range may be implemented using common signal source 510 and common power dividers 508 as in selectable local oscillator 500. If however $Y_0$ and $Z_0$ cannot be so determined in step 208, then an additional decision step may direct method 200 back to step 202 to re-determine one or more parameters in steps 202, 204 or 206 until equations 5 to 9 can be solved in step 208 with the necessary relationship between $X_0$, $Y_0$ and $Z_0$.

Using the modified version of method 200, selectable local oscillator 500 can achieve the same output frequency range as that provided by the selectable local oscillator 10 or the selectable local oscillator 400 depending on how these oscillators are configured. For example, the selectable local oscillator 500 can produce the same output frequency range as in the example implementation presented in FIGS. 4A-4D. The common signal source 510 can be configured to provide frequency signals with frequencies of 37.5 MHz, 40.5 MHz and 43.5 MHz. Using a frequency division factor of p=3 in the signal generator 502 results in frequency signals with frequencies of 12.5 MHz, 13.5 MHz and 14.5 MHz for the frequency range Fx_range. For signal generator 504, configuring signal source 408 to provide a frequency signal of 727.5 MHz and then mixing provides upper side band frequencies of 765 MHz, 768 MHz and 771 MHz for Fy_range. For signal generator 506, using a frequency multiplication factor of q=3 results in frequency signals with frequencies of 112.5 MHz, 121.5 MHz and 130.5 MHz at the output of the filter 414. Configuring the signal source 416 to provide a frequency signal of 2411 MHz, mixing with the output of the filter 414 and selecting the upper side band then results in frequency signals with frequencies of 2523.5 MHz, 2532.5 MHz and 2541.5 MHz for the frequency range Fz_range. The end result is the same output frequency ranges of 1738 MHz to 1791 MHz with a 1 MHz spacing or 3274 MHz to 3327 MHz with a 1 MHz spacing as shown in FIGS. 4A-4D.

It should be noted that increasing the number of frequency signals that can be generated by the signal sources 408 and 416 for the selectable local oscillators 400 and 500 results in larger output frequency ranges. For example, the selectable local oscillator 500, can also be configured to provide an output frequency range of 1712 MHz to 1927 MHz with a 1 MHz spacing or 3193 MHz to 3408 MHz with a 1 MHz spacing. Each of these output frequency ranges has a bandwidth of approximately 200 MHz. This can be accomplished as follows. The common signal source 510 is configured to provide frequency signals with frequencies of 159 MHz, 162 MHz and 165 MHz. Using a frequency division factor of p=3 results in frequency signals with frequencies of 53 MHz, 54 MHz and 55 MHz for the frequency range Fx_range. Configuring the signal sources 408 to provide frequency signals with frequencies of 574 MHz and 583 MHz, mixing and taking the upper side band product results in frequency signals with frequencies of 733 MHz, 736 MHz, 739 MHz, 742 MHz, 745 MHz and 748 MHz for the frequency range Fy_range. The signal generator 506 is then configured by using a multiplication factor of q=6 to generate frequency signals with frequencies of 954 MHz, 972 MHz and 990 MHz at the output of the filter 414. The signal source 416 is configured to generate frequency signals with frequencies of 1561 MHz and 1615 MHz. Mixing the output of the signal source 416 by the output of the filter 414 and taking the upper side band signal results in frequency signals with frequencies of 2515 MHz, 2533 MHz, 2551 MHz, 2569 MHz, 2587 MHz, and 2605 MHz for the frequency range Fz_range.

Figure 8:
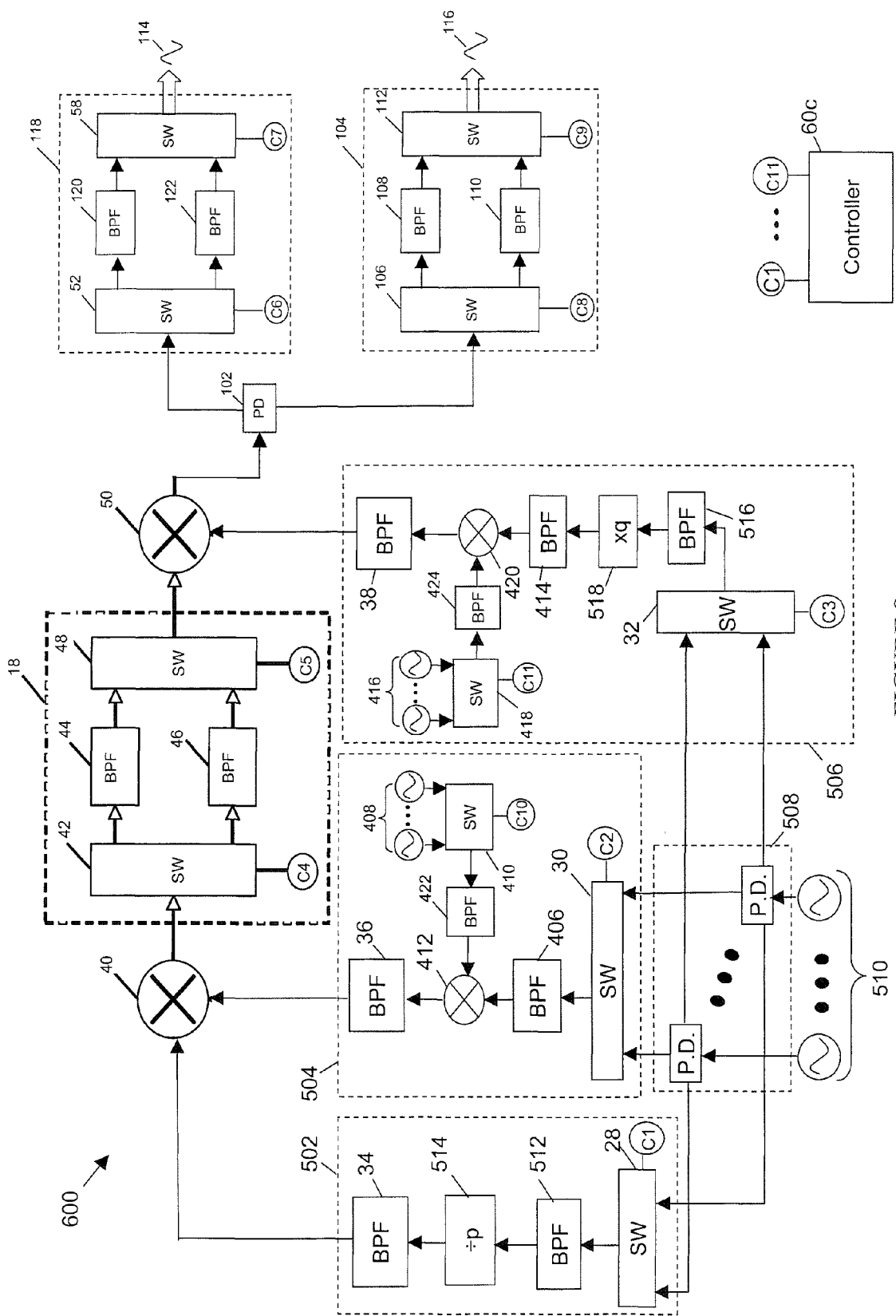
FIG. 8 is a block diagram of an example embodiment of another selectable local oscillator that can produce an output frequency signal having a selectable frequency within a desired output frequency range.

Referring now to FIG. 8, shown therein is a block diagram of an example embodiment of another selectable local oscillator 600 that can produce an output frequency signal having a selectable frequency within a desired output frequency range. The selectable local oscillator 600 has an architecture that combines features of selectable local oscillator 500, as shown in FIG. 7, and selectable local oscillator 100, as shown in FIG. 2. Specifically, selectable local oscillator 600 comprises signal generators 502, 504 and 506, as in FIG. 7, but instead of a single output stage 20, there is included power divider 102 and output stages 118 and 104. As before the output of the mixer 50 is connected to a 1:2 power divider 102 and the two output ports of the power divider 102 are connected to the output stages 118 and 104. The filter 120 has a passband similar to the frequency range F_bpf54_usb_range, while the filter 122 has a passband similar to the frequency range F_bpf56_usb_range. Moreover, the filter 108 has a passband similar to the frequency range F_bpf54_lsb_range, while the filter 110 has a passband similar to the frequency range F_bpf56_lsb_range. Accordingly, the output stage 118 provides an output frequency signal 114 with a frequency in the F_usb_range output frequency range and the output stage 104 provides an output frequency signal 116 with a frequency in the F_lsb_range output frequency range. The use of two filters in each output stage protects against spurious frequencies.

Using the modified version of method 200 described previously in the context of selectable local oscillator 500, selectable local oscillator 600 can achieve the same output frequency ranges as can be provided by selectable local oscillator 500. Specifically, selectable local oscillator 500 can produce the same output frequency range as in the example implementation presented in FIGS. 4A-4D, comprising a lower sideband of output frequencies in the range 1738 MHz to 1791 MHz with a 1 MHz spacing, and an upper sideband in the range 3274 MHz to 3327 MHz also with a 1 MHz spacing. By increasing the number of frequency signals that can be generated by the signal sources 408 and 416, selectable local oscillator 600 can also provide an output frequency range comprising a lower sideband of output frequencies in the range 1712 MHz to 1927 MHz with a 1 MHz spacing, and an upper sideband in the range 3193 MHz to 3408 MHz also with a 1 MHz spacing, as seen previously. By incorporating dual output stages 118 and 118, as opposed to single output stage 20, selectable local oscillator 600 can provide both output frequency signal 114 with a frequency in the F_usb_range output frequency range and output frequency signal 116 with a frequency in the F_lsb_range output frequency range.

It will be appreciated how the modified configuration method suitable for configuring selectable local oscillator 500 shown in FIG. 7, is suitable also without further modification for configuring selectable local oscillator 600 sown in FIG. 8.

Referring now to FIG. 9, shown therein is a block diagram of an example embodiment of another selectable local oscillator 700 that can produce an output frequency signal having a selectable frequency within a desired output frequency range. The selectable local oscillator 700 has a somewhat different topology than the selectable local oscillator 600. The selectable local oscillator 700 is implemented in a more efficient manner by reducing the number of signal sources and can be configured to provide a similar output frequency range as the selectable local oscillator 600.

The selectable local oscillator 700 includes signal generators 754, 704 and 706. The signal generator 754 operates the same as signal generator 502 described for the selectable local oscillator 600 with frequency divider 756 set to p=3. The signal generators 704 and 706 are similar to the signal generators 504 and 506, except that the signal sources 408 and 416 are replaced by a common signal source 708 and common power dividers 750 and 752. Frequency multiplier 760 in signal generator 706 is also set to q=6. The number of common power dividers 750 and 752 is the same as the number of frequency signals in common signal source 708. Use of common signal source 708 allows for a lower cost implementation.

The first and second common signal sources 710 and 708 are used to provide two different sets of frequency signals, a frequency divider 756 is used for dividing a first selected frequency signal when generating the first selectable frequency signal and a frequency multiplier 760 is used for multiplying a second selected frequency signal when generating the third selectable frequency signal.

As in selectable local oscillator 100 shown in FIG. 2, the mixed product signal outputted by mixer 50 is provided to power divider 102, the outputs of which are provided to output stages 726 and 712. Output stages 726 and 712 operate similarly to the output stages 118 and 104 described for the selectable local oscillator 100. In this case, the output stages 726 and 712 are used to produce output frequency signals in each of the upper and lower sideband of the output frequency range. Specifically, output stage 726 provides a frequency signal in the upper sideband, while output stage 712 provides a frequency signal in the lower sideband. The output stage 726 operates in a similar manner as the output stage 118 except that additional filters 732 to 738 are incorporated and configured to pass portions of the upper side band of the output frequency range while preventing noise and spurious mixer product components from entering the output frequency signal. Output stage 712 also comprises additional filters 716 to 724 configured to pass portions of the lower side band of the output frequency range. Output stages 726 and 712 can be taken together and considered to be an output stage with a plurality of filters for filtering at least one of the upper and lower sidebands of the second mixed product signal to prevent spurious mixer product components in the output frequency signal.

The selectable local oscillator 700 can be configured such that the upper side band provided by the output stage 726 and the lower side bad provided by the output stage 712 are the same as the second example given for the selectable local oscillator 500 with increased input frequencies. That is, the selectable local oscillator 700 can be configured to provide an output frequency range of 1712 MHz to 1927 MHz with a 1 MHz spacing and 3193 MHz to 3408 MHz with a 1 MHz spacing, which is the same output frequency range as that provided by the selectable local oscillator 500. Each of these output frequency ranges has a bandwidth of approximately 200 MHz. This can be accomplished as follows. The common signal source 710 is configured to provide frequency signals with frequencies of 159 MHz, 162 MHz and 165 MHz. Using a frequency division factor of p=3 results in frequency signals with frequencies of 53 MHz, 54 MHz and 55 MHz for the frequency range Fx_range. Configuring the signal source 708 to provide frequency signals with frequencies of 493.6 MHz and 502.6 MHz, mixing and taking the upper side band product results in frequency signals with frequencies of 625.6 MHz, 655.6 MHz, 658.6 MHz, 661.6 MHz, 664.6 MHz and 667.6 MHz for the frequency range Fy_range of the signal generator 704. The signal generator 706 is then configured by using a multiplication factor of q=6. The output of the filter 758 is similar to the output of the filter 36 and so the frequency signals generated by the signal generator 706 are the same as those generated by the signal generator 704 but multiplied by 6 in this case. Accordingly, the signal generator 706 generates frequency signals with frequencies of 3915.6 MHz, 3933.6 MHz, 3951.6 MHz, 3969.6 MHz, 3987.6 MHz and 4005.6 MHz for the frequency range Fz_range when the upper side band output of the mixer 420 is used. These frequency ranges are the same as those generated in the example configuration given for the selectable local oscillator 500.

At the output stages 726 and 712, filters 718 to 724 and 732 to 738 are configured to provide a quarter of the output range of the upper side band and the lower side band respectively of the output frequency range. Accordingly, for the output range of 3193 MHz to 3408 MHz, the filter 718 has a passband to allow output frequencies of 3193 to 3246 MHz, the filter 720 has a passband to allow output frequencies of 3247 to 3300 MHz, the filter 722 has a passband to allow output frequencies of 3301 to 3354 MHz and the filter 724 has a passband to allow output frequencies of 3355 to 3408 MHz. For the output frequency range of 1712 MHz to 1927 MHz, the filter 732 has a passband to allow output frequencies of 1712 to 1765 MHz, the filter 734 has a passband to allow output frequencies of 1766 to 1819 MHz, the filter 736 has a passband to allow output frequencies of 1820 to 1873 MHz and the filter 738 has a passband to allow output frequencies of 1874 to 1927 MHz.

It will be appreciated how method 200 for configuring selectable local oscillator 10 as shown in FIG. 1 can, with suitable modification, be adapted also for configuring selectable local oscillator 700.

The example embodiments described above, with reference to the accompanying drawings, relate to a selectable local oscillator and a method for configuring it to provide a desired output frequency range. The selectable local oscillator can be configured to have certain characteristics, such as wide-bandwidth, high resolution, low spurious signals and fast switching and can also be produced at low cost. The selectable local oscillator can be configured for operation in various frequency ranges including the S-band (i.e. 2700 to 2900 MHz) or the L-band (1250 to 1350 MHz) with a certain step spacing, such as 1 MHz, in each of these bands. In an alternative, the selectable local oscillator can be configured such that the USB of the output frequency range provides a signal in the S-band and the LSB of the output frequency range provides a signal in the L-band. This will maximize the common parts between S-band synthesis and L-band synthesis and reduce production cost.

In the design of the selectable local oscillators, the output frequency range and the input frequencies to the mixers 40 and 50 are selected. If it then determined that the upper side band output of the mixer 412 contains too many spurious frequencies and too many bandpass filters are required to avoid them, then the lower side band output of the mixer 412 can be used to provide the same frequency signals without as many spurious frequencies by providing different frequency signals from the common signal source 508. This approach can also be used for the mixer 420. This provides more flexibility in the design of the selectable local oscillator 800. This approach can also be used for other embodiments described herein in which the signal generators themselves use mixers such as signal oscillators 400, 500, 600 and 700.

It should be noted that in the embodiments described herein, an output frequency offset mixer stage can be added after the output stage of the selectable local oscillators so that lower frequency signals can be generated by the signal generators and mixed with another frequency signal to be frequency translated or shifted up to the desired output frequency range. The output frequency offset stage can be implemented such as those shown discussed in FIG. 6. For example, a frequency offset mixer stage can be added after the output stage 20 in the selectable local oscillator 10 of FIG. 1 to shift the center frequency of the generated frequencies to the desired output frequency range of the selectable local oscillator. This allows using a basic synthesis circuitry for any different output center frequencies. Hence, with this addition, the implementation of the selectable local oscillator for different output frequency ranges will have standard reusable parts, i.e. a standard block diagram, standard printed circuit board layout, standard mechanical housing, a standard assembly drawing, etc. and low production cost.

It should also be noted that in the embodiments described herein, at least one of the signal sources can be implemented with a Direct Digital Synthesizer (DDS) rather than a plurality of fixed frequency oscillators. A DDS converts phase data generated by a phase accumulator into a digital frequency signal that is subsequently converted into a commensurate analog signal by a digital-to-analog converter. A DDS can provide a low noise frequency signal and can also increase spectral resolution since a DDS generally has a higher resolution relative to comparable analog synthesizers. However, a DDS produces more noise than the combination of a crystal oscillator and a switch (i.e. a DDS generally has higher spurious noise levels) and so has to be used judiciously.

While certain features have been illustrated and described for the various embodiments discussed herein, modifications, substitutions, changes, and equivalents can be made, without departing from the scope of these embodiments as defined in the appended claims.

The invention claimed is:

1. A method for configuring a selectable local oscillator to provide an output frequency signal having a selectable frequency within a desired output frequency range, wherein the method comprises:
    determining first, second and third input frequency ranges;
    generating first, second and third selectable frequency signals from the first, second and third input frequency ranges respectively;
    mixing the first selectable frequency signal with the second selectable frequency signal to provide a first mixed product signal having an upper sideband and a lower sideband;
    selecting one of the upper and lower sidebands of the first mixed product signal;
    mixing the selected sideband with the third selectable frequency signal to provide a second mixed product signal having an upper sideband and a lower sideband; and
    selecting at least one of the upper and lower sidebands of the second mixed product signal as the output frequency signal wherein the step of determining the first, second and third input frequency ranges comprises:
    determining a number of frequencies, a frequency interval, a lower bound frequency, and an upper bound frequency for the desired output frequency range;
    determining a number of frequencies in each of the first, second and third input frequency ranges based on the number of frequencies of the desired output frequency range; and
    determining a frequency interval and a lower bound frequency for each of the first, second and third input frequency ranges.

2. The method of claim 1, wherein the step of determining a frequency interval for each of the first, second and third input frequency ranges is based on the frequency interval of the desired output frequency range and the number of frequencies in the first and second input frequency ranges.

3. The method of claim 2, wherein the method further comprises setting the frequency interval of the first input frequency range equal to the frequency interval of the desired output frequency range, setting the frequency interval of the second input frequency range equal to the number of frequencies in the first interval range multiplied by the frequency interval of the first input frequency range and setting the frequency interval of the third input frequency range equal to the number of frequencies in the second input frequency range multiplied by the frequency interval of the second input frequency range.

4. The method of claim 1, wherein the step of determining a lower bound frequency for the first input frequency range is based on the number of frequencies in the second and third input frequency ranges and the frequency intervals in the first, second and third input frequency ranges.

5. The method of claim 1, wherein the step of determining a lower bound frequency for the second and third input frequency ranges is based on the upper and lower bound frequencies of a sideband of the desired output frequency range, the number of frequencies in the first, second and third input frequency ranges and the frequency interval of the first, second and third input frequency ranges.

6. The method of claim 1, wherein the step of determining the first, second and third input frequency ranges further comprises selecting frequency values for at least one of the first, second and third input frequency ranges to prevent undesirable spurious mixer product signals in the desired output frequency range.

7. The method of claim 1, wherein the step of determining the first, second and third input frequency ranges further comprises selecting frequency values for at least one of the first, second and third input frequency ranges to limit undesirable spurious mixer product signals in the desired output frequency range to higher than $8^{th}$ order spurious mixer product signals.

8. The method of claim 1, wherein the method further comprises mixing frequency signals from two different sets of frequency signals to generate the second and third selectable frequency signals.

9. The method of claim 8, wherein the method further comprises using a common signal source to provide a first set of frequency signals, using a frequency divider when generating the first selectable frequency signal, and using a frequency multiplier when generating the third selectable frequency signal.

10. The method of claim 8, wherein the first and second sets of frequency signals are provided by first and second common signal sources respectively, a frequency divider is used when generating the first selectable frequency signal, and a frequency multiplier is used when generating the third selectable frequency signal.

11. The method of claim 1, wherein the step of selecting at least one of the upper and lower sidebands of the second mixed product signal comprises using a plurality of filters to prevent spurious mixer product components in the output frequency signal.

12. A selectable local oscillator for producing an output frequency signal having a selectable frequency within a desired output frequency range, wherein the selectable local oscillator comprises:
  a first signal generator configured to provide a first selectable frequency signal having a frequency in a first input frequency range;
  a second signal generator configured to provide a second selectable frequency signal having a frequency in a second input frequency range;
  a first mixer configured to mix the first selectable frequency signal with the second selectable frequency signal to provide a first mixed product signal having an upper sideband and a lower sideband;
  a frequency selector configured to select one of the upper and lower sidebands of the first mixed product signal;
  a third signal generator configured to provide a third selectable frequency signal having a frequency in a third input frequency range;
  a second mixer configured to mix the output of the frequency selector with the third selectable frequency signal to provide a second mixed product signal having an upper sideband and a lower sideband; and
  an output stage configured to select at least one of the upper and lower sidebands of the second mixed product signal as the output frequency signal, wherein the first, second and third signal generators each comprise:
    a signal source configured to provide a plurality of frequency signals;
    a switch configured to select one of the plurality of frequency signals; and
    a bandpass filter configured to filter an output of the switch.

13. A selectable local oscillator for producing an output frequency signal having a selectable frequency within a desired output frequency range, wherein the selectable local oscillator comprises:
  a first signal generator configured to provide a first selectable frequency signal having a frequency in a first input frequency range;
  a second signal generator configured to provide a second selectable frequency signal having a frequency in a second input frequency range;
  a first mixer configured to mix the first selectable frequency signal with the second selectable frequency signal to provide a first mixed product signal having an upper sideband and a lower sideband;
  a frequency selector configured to select one of the upper and lower sidebands of the first mixed product signal;
  a third signal generator configured to provide a third selectable frequency signal having a frequency in a third input frequency range;
  a second mixer configured to mix the output of the frequency selector with the third selectable frequency signal to provide a second mixed product signal having an upper sideband and a lower sideband; and
  an output stage configured to select at least one of the upper and lower sidebands of the second mixed product signal as the output frequency signal wherein at least one of the frequency selectors comprises:
    a first and a second bandpass filter;
    a first switch that is configured to route an input of the frequency selector to one of the first and second bandpass filters; and
    a second switch that is configured to route an output of the first or the second bandpass filter to an output of the frequency selector.

14. A selectable local oscillator for producing an output frequency signal having a selectable frequency within a desired output frequency range, wherein the selectable local oscillator comprises:
  a first signal generator configured to provide a first selectable frequency signal having a frequency in a first input frequency range;
  a second signal generator configured to provide a second selectable frequency signal having a frequency in a second input frequency range;
  a first mixer configured to mix the first selectable frequency signal with the second selectable frequency signal to provide a first mixed product signal having an upper sideband and a lower sideband;
  a frequency selector configured to select one of the upper and lower sidebands of the first mixed product signal;
  a third signal generator configured to provide a third selectable frequency signal having a frequency in a third input frequency range;
  a second mixer configured to mix the output of the frequency selector with the third selectable frequency signal to provide a second mixed product signal having an upper sideband and a lower sideband; and
  an output stage configured to select at least one of the upper and lower sidebands of the second mixed product signal as the output frequency signal, wherein frequency values for the first, second and third input frequency ranges are determined by:
    determining a number of frequencies, a frequency interval, a lower bound frequency, and an upper bound frequency for the desired output frequency range;
    determining a number of frequencies in each of the first, second and third input frequency ranges based on the number of frequencies of the desired output frequency range; and
    determining a frequency interval and a lower bound frequency for each of the first, second and third input frequency ranges.

15. A selectable local oscillator for producing an output frequency signal having a selectable frequency within a desired output frequency range, wherein the selectable local oscillator comprises:
  a first signal generator configured to provide a first selectable frequency signal having a frequency in a first input frequency range;
  a second signal generator configured to provide a second selectable frequency signal having a frequency in a second input frequency range;
  a first mixer configured to mix the first selectable frequency signal with the second selectable frequency signal to provide a first mixed product signal having an upper sideband and a lower sideband;
  a frequency selector configured to select one of the upper and lower sidebands of the first mixed product signal;
  a third signal generator configured to provide a third selectable frequency signal having a frequency in a third input frequency range;
  a second mixer configured to mix the output of the frequency selector with the third selectable frequency signal to provide a second mixed product signal having an upper sideband and a lower sideband; and an output stage configured to select at least one of the upper and lower sidebands of the second mixed product signal as the output frequency signal, wherein the second and third signal generators comprise mixers configured to mix frequency signals from two different sets of frequency signals to generate the second and third selectable frequency signals.

16. The selectable local oscillator of claim 15, wherein the selectable local oscillator further comprises a common signal source to provide a first set of frequency signals to the first, second and third signal generators, a frequency divider for dividing a selected frequency signal when generating the first selectable frequency signal, and a frequency multiplier for multiplying a selected frequency signal when generating the third selectable frequency signal.

17. The selectable local oscillator of claim 15, wherein the selectable local oscillator further comprises first and second common signal sources to provide the two different sets of frequency signals, a frequency divider for dividing a first selected frequency signal when generating the first selectable frequency signal, and a frequency multiplier for multiplying a second selected frequency signal when generating the third selectable frequency signal.

18. A selectable local oscillator for producing an output frequency signal having a selectable frequency within a desired output frequency range, wherein the selectable local oscillator comprises:

a first signal generator configured to provide a first selectable frequency signal having a frequency in a first input frequency range;

a second signal generator configured to provide a second selectable frequency signal having a frequency in a second input frequency range;

a first mixer configured to mix the first selectable frequency signal with the second selectable frequency signal to provide a first mixed product signal having an upper sideband and a lower sideband;

a frequency selector configured to select one of the upper and lower sidebands of the first mixed product signal;

a third signal generator configured to provide a third selectable frequency signal having a frequency in a third input frequency range;

a second mixer configured to mix the output of the frequency selector with the third selectable frequency signal to provide a second mixed product signal having an upper sideband and a lower sideband; and an output stage configured to select at least one of the upper and lower sidebands of the second mixed product signal as the output frequency signal, wherein the output stage comprises a plurality of filters for filtering one of the upper and lower sidebands of the second mixed product signal to prevent spurious mixer product components in the output frequency signal.

* * * * *